(12) United States Patent
Partlo et al.

(10) Patent No.: US 7,317,196 B2
(45) Date of Patent: Jan. 8, 2008

(54) LPP EUV LIGHT SOURCE

(75) Inventors: William N. Partlo, Poway, CA (US); Daniel J. W. Brown, San Diego, CA (US); Igor V. Fomenkov, San Diego, CA (US); Alexander I. Ershov, San Diego, CA (US); David W. Myers, Poway, CA (US)

(73) Assignee: Cymer, Inc., San Diego, CA (US)

( * ) Notice: Subject to any disclaimer, the term of this patent is extended or adjusted under 35 U.S.C. 154(b) by 415 days.

(21) Appl. No.: 10/979,919

(22) Filed: Nov. 1, 2004

(65) Prior Publication Data

US 2005/0205811 A1 Sep. 22, 2005

Related U.S. Application Data

(63) Continuation-in-part of application No. 10/803,526, filed on Mar. 17, 2004, now Pat. No. 7,087,914.

(51) Int. Cl.
H01J 35/20 (2006.01)

(52) U.S. Cl. .............................. 250/504 R; 250/493.1; 378/119

(58) Field of Classification Search ............ 250/504 R, 250/503.1, 493.1; 378/119; 372/5, 18, 70, 372/38.02, 9; 359/334, 338
See application file for complete search history.

(56) References Cited

U.S. PATENT DOCUMENTS 2,759,106 A 8/1956 Wolter ......................... 250/53

(Continued)

FOREIGN PATENT DOCUMENTS

JP 2000091096 A 3/2000

OTHER PUBLICATIONS

Andreev, et al., "Enhancement of laser/EUV conversion by shaped laser pulse interacting with Li-contained targets for EUV lithography", Proc. Of *SPIE*, 5196:128-136, (2004).

(Continued)

*Primary Examiner*—Jack I. Berman
*Assistant Examiner*—Michael J Logie
(74) *Attorney, Agent, or Firm*—William Cray

(57) ABSTRACT

An apparatus and method is described for effectively and efficiently providing plasma irradiation laser light pulses in an LPP EUV light source which may comprise a laser initial target irradiation pulse generating mechanism irradiating a plasma initiation target with an initial target irradiation pulse to form an EUV generating plasma having an emission region emitting in-band EUV light; a laser plasma irradiation pulse generating mechanism irradiating the plasma with a plasma irradiation pulse after the initial target irradiation pulse so as to compress emission material in the plasma toward the emission region of the plasma. The plasma irradiation pulse may comprise a laser pulse having a wavelength that is sufficiently longer than a wavelength of the initial target irradiation pulse to have an associated lower critical density resulting in absorption occurring within the plasma in a region of the plasma defined by the wavelength of the plasma irradiation pulse sufficiently separated from an initial target irradiation site to achieve compression of the emission material, and the may compress the emission region. The laser plasma irradiation pulse may produce an aerial mass density in the ablating cloud of the plasma sufficient to confine the favorably emitting plasma for increased conversion efficiency. The deposition region for the plasma irradiation pulse may be is removed enough from the initial target surface so as to insure compression of the favorably emitting plasma. A high conversion efficiency laser produced plasma extreme ultraviolet ("EUV") light source may comprise a laser initial target irradiation pulse generating mechanism irradiating a plasma initiation target with a target irradiation pulse to form an EUV generating plasma emitting in-band EUV light; a plasma tamper substantially surrounding the plasma to constrain the expansion of the plasma.

28 Claims, 24 Drawing Sheets

U.S. PATENT DOCUMENTS

| | | | |
|---|---|---|---|
| 3,150,483 A | 9/1964 | Mayfield et al. | 60/35.5 |
| 3,232,046 A | 2/1966 | Meyer | 50/35.5 |
| 3,279,176 A | 10/1966 | Boden | 60/202 |
| 3,746,870 A | 7/1973 | Demarest | 250/227 |
| 3,960,473 A | 6/1976 | Harris | 425/467 |
| 3,961,197 A | 6/1976 | Dawson | 250/493 |
| 3,969,628 A | 7/1976 | Roberts et al. | 250/402 |
| 4,042,848 A | 8/1977 | Lee | 313/231.6 |
| 4,088,966 A | 5/1978 | Samis | 313/231.5 |
| 4,143,275 A | 3/1979 | Mallozzi et al. | 250/503 |
| 4,162,160 A | 7/1979 | Witter | 75/246 |
| 4,203,393 A | 5/1980 | Giardini | 123/30 |
| 4,364,342 A | 12/1982 | Asik | 123/143 |
| 4,369,758 A | 1/1983 | Endo | 123/620 |
| 4,504,964 A | 3/1985 | Cartz et al. | 378/119 |
| 4,507,588 A | 3/1985 | Asmussen et al. | 315/39 |
| 4,536,884 A | 8/1985 | Weiss et al. | 378/119 |
| 4,538,291 A | 8/1985 | Iwamatsu | 378/119 |
| 4,561,406 A | 12/1985 | Ward | 123/536 |
| 4,596,030 A | 6/1986 | Herziger et al. | 378/119 |
| 4,618,971 A | 10/1986 | Weiss et al. | 378/34 |
| 4,626,193 A | 12/1986 | Gann | 431/71 |
| 4,633,492 A | 12/1986 | Weiss et al. | 378/119 |
| 4,635,282 A | 1/1987 | Okada et al. | 378/34 |
| 4,751,723 A | 6/1988 | Gupta et al. | 378/119 |
| 4,752,946 A | 6/1988 | Gupta et al. | 378/119 |
| 4,774,914 A | 10/1988 | Ward | 123/162 |
| 4,837,794 A | 6/1989 | Riordan et al. | 378/119 |
| 4,928,020 A | 5/1990 | Birx et al. | 307/106 |
| 5,023,897 A | 6/1991 | Neff et al. | 378/122 |
| 5,027,076 A | 6/1991 | Horsley et al. | 324/674 |
| 5,102,776 A | 4/1992 | Hammer et al. | 430/311 |
| 5,126,638 A | 6/1992 | Dethlefsen | 315/326 |
| 5,142,166 A | 8/1992 | Birx | 307/419 |
| 5,175,755 A | 12/1992 | Kumakhov | 378/34 |
| 5,313,481 A | 5/1994 | Cook et al. | 372/37 |
| 5,319,695 A | 6/1994 | Itoh et al. | 378/84 |
| RE34,806 E | 12/1994 | Cann | 427/446 |
| 5,411,224 A | 5/1995 | Dearman et al. | 244/53 |
| 5,448,580 A | 9/1995 | Birx et al. | 372/38 |
| 5,504,795 A | 4/1996 | McGeoch | 378/119 |
| 5,729,562 A | 3/1998 | Birx et al. | 372/38 |
| 5,763,930 A | 6/1998 | Partlo | 250/504 |
| 5,866,871 A | 2/1999 | Birx | 219/121 |
| 5,936,988 A | 8/1999 | Partlo et al. | 372/38 |
| 5,963,616 A | 10/1999 | Silfvast et al. | 378/122 |
| 5,970,076 A | 10/1999 | Hamada | 372/20 |
| 6,031,241 A | 2/2000 | Silfvast et al. | 250/504 |
| 6,031,598 A | 2/2000 | Tichenor et al. | 355/67 |
| 6,039,850 A | 3/2000 | Schulz | 204/192.15 |
| 6,051,841 A | 4/2000 | Partlo | 250/504 |
| 6,064,072 A | 5/2000 | Partlo et al. | 250/504 |
| 6,172,324 B1 | 1/2001 | Birx | 219/121.57 |
| 6,195,272 B1 | 2/2001 | Pascente | 363/21 |
| 6,285,743 B1 | 9/2001 | Kondo et al. | 378/119 |
| 6,307,913 B1 | 10/2001 | Foster et al. | 378/34 |
| 6,317,448 B1 | 11/2001 | Das et al. | 372/32 |
| 6,377,651 B1 | 4/2002 | Richardson et al. | 378/34 |
| 6,396,900 B1 | 5/2002 | Barbee, Jr. et al. | 378/84 |
| 6,452,194 B2 | 9/2002 | Bijkerk et al. | 250/492.2 |
| 6,452,199 B1 | 9/2002 | Partlo et al. | 250/504 |
| 6,493,423 B1 | 12/2002 | Bisschops | 378/119 |
| 6,566,667 B1 | 5/2003 | Partlo et al. | 250/504 |
| 6,566,668 B2 | 5/2003 | Rauch et al. | 250/504 |
| 6,576,912 B2 | 6/2003 | Visser et al. | 250/492.2 |
| 6,580,517 B2 | 6/2003 | Lokai et al. | 356/519 |
| 6,586,757 B2 | 7/2003 | Melnychuk et al. | 250/504 |
| 6,590,959 B2 | 7/2003 | Kandaka et al. | 378/119 |
| 6,647,086 B2 | 11/2003 | Amemiya et al. | 378/34 |
| 6,744,060 B2 | 6/2004 | Ness et al. | 315/111.01 |
| 6,804,327 B2 | 10/2004 | Schriever et al. | 378/119 |
| 6,815,700 B2 | 11/2004 | Melnychuk et al. | 250/504 |
| 6,865,255 B2 | 3/2005 | Richardson | 378/119 |
| 2003/0068012 A1 | 4/2003 | Ahmad et al. | 378/119 |
| 2003/0219056 A1 | 11/2003 | Yager et al. | 372/57 |

OTHER PUBLICATIONS

Apruzese, J.P., "X-Ray Laser Research Using Z Pinches," *Am. Inst. of Phys.* 399-403, (1994).

Bollanti, et al., "Compact Three Electrodes Excimer Laser IANUS for a POPA Optical System," *SPIE Proc.* (2206)144-153, (1994).

Bollanti, et al., "Ianus, the three-electrode excimer laser," *App. Phys. B (Lasers & Optics)* 6(4):401-406, (1998).

Braun, et al., "Multi-component EUV Multilayer Mirrors," *Proc. SPIE*, 5037:2-13, (2003).

Choi, et al., "A $10^{13}$ A/s High Energy Density Micro Discharge Radiation Source," *B. Radiation Characteristics*, p. 287-290.

Choi, et al., "Fast pulsed hollow cathode capillary discharge device," *Rev. of Sci. Instrum.* 69(9):3118-3122 (1998).

Choi et al., Temporal development of hard and soft x-ray emission from a gas-puff Z pinch, Rev. Sci. Instrum. 57(8), pp. 2162-2164 (Aug. 1986).

H. Eichler, et al., "Phase conjugation for realizing lasers with diffraction limited beam quality and high average power," Technische Universitat Berlin, Optisches Institut, (Jun. 1998).

R. Fedosejevs and A. A. Offenberger, "Subnanosecond pulses from a KrF Laser pumped $SF_6$ Brillouin Amplifier", IEEE J. QE 21, 1558-1562 (1985).

Feigl, et al., "Heat Resistance of EUV Multilayer Mirrors for Long-time Applications," *Microelectric Engineering*, 57-58:3-8, (2001).

Fomenkov, et al., "Characterization of a 13.5nm Source for EUV Lithography based on a Dense Plasma Focus and Lithium Emission," Sematech Intl. Workshop on EUV Lithography (Oct. 1999).

Giordano and Letardi, "Magnetic pulse compressor for prepulse discharge in spiker-sustainer excitati technique for Xe-Cl lasers," Rev. Sci. Instrum 65(8), pp. 2475-2481 (Aug. 1994).

Hansson, et al., "Xenon liquid jet laser-plasma source for EUV lithography," Emerging Lithographic Technologies IV, *Proc. Of SPIE*, vol. 3997:729-732 (2000).

Jahn, Physics of Electric Propulsion, McGraw-Hill Book Company, (Series in Missile and Space U.S.A.), Chap. 9, "Unsteady Electromagnetic Acceleration," pp. 257 (1968).

Shibin Jiang, et al., "Compact multimode pumped erbium-doped phosphate fiber amplifiers," Optical Engineering, vol. 42, Issue 10, pp. 2817-2820 (Oct. 2003).

Kato, Yasuo, "Electrode Lifetimes in a Plasma Focus Soft X-Ray Source," *J. Appl. Phys.* (33) Pt. 1, No. 8:4742-4744 (1991).

Kato, et al., "Plasma focus x-ray source for lithography," Am. Vac. Sci. Tech. B., 6(1): 195-198 (1988).

K. Kuwahara et al., "Short-pulse generation by saturated KrF laser amplification of a steep Stokes pulse produced by two-step stimulated Brillouin scattering", J. Opt. Soc. Am. B 17, 1943-1947 (2000).

Lange, Michael R., et al., "High gain coefficient phosphate glass fiber amplifier," NFOEC 2003, paper No. 126.

Lebert, et al., "Soft x-ray emission of laser-produced plasmas using a low-debris cryogenic nitrogen target," *J. App. Phys.*, 84(6):3419-3421 (1998).

Lebert, et al., "A gas discharged based radiation source for EUV-lithography," Intl. Conf. Micro and Nano-Engineering 98 (Sep. 22-24, 1998) Leuven, Belgium.

Lebert, et al., "Investigation of pinch plasmas with plasma parameters promising ASE," Inst. Phys. Conf. Ser No. 125: Section 9, pp. 411-415 (1995) Schiersee, Germany.

Lebert, et al., "Comparison of laser produced and gas discharge based EUV sources for different applications," Intl. Conf. Micro- and Nano-Engineering 98 (Sep. 22-24, 1998) Leuven, Belgium.

Lee, Ja H., "Production of dense plasma in hypocycloidal pinch apparatus," *The Phys. Of Fluids*, 20(2):313-321 (1977).

Lewis, Ciaran L.S., "Status of Collision-Pumped X-ray Lasers," *Am Inst. Phys.* pp. 9-16 (1994).

Lowe, "Gas plasmas yield X-rays for Lithography," Electronics, pp. 40-41 (Jan. 27, 1982).

Malmqvist, et al., "Liquid-jet target for laser-plasma soft x-ray generation," *Am. Inst. Phys.* 67(12):4150-4153 1996).

Mather, "Formation of a High-Density Deuterium Plasma Focus," The Physics of Fluids, 8(2), 366-377 (Feb. 1965).

Mather, et al., "Stability of the Dense Plasma Focus," *Phys. Of Fluids*, 12(11):2343-2347 (1969).

Matthews and Cooper, "Plasma sources for x-ray lithography," SPIE, 333, Submicron Lithography, pp. 136-139 (1982).

Mayo, et al., "A magnetized coaxial source facility for the generation of energetic plasma flows," *Sci. Technol.* vol. 4:pp. 47-55 (1994).

Mayo, et al., "Initial Results on high enthalpy plasma generation in a magnetized coaxial source," *Fusion Tech* vol. 26:1221-1225 (1994).

Nilsen, et al., "Analysis of resonantly photopumped Na-Ne x-ray-laser scheme," *Am Phys. Soc.* 44(7):4591-4597 (1991).

H. Nishioka et al., "UV saturable absorber for short-pulse KrF laser systems", Opt. Lett. 14, 692-694 (1989).

Orme, et al., "Electrostatic charging and deflection of nonconventional droplet streams formed from capillary stream breakup," *Physics of Fluids*, 12(9):2224-2235, (Sep. 2000).

Orme, et al., "Charged Molten Metal Droplet Deposition As a Direct Write Technology", MRS 2000 Spring Meeting, San Francisco, (Apr. 2000).

Pant, et al., "Behavior of expanding laser produced plasma in a magnetic field," *Physica Sripta*, T75:104-111, (1998).

Partlo, et al., "EUV (13.5nm) Light Generation Using a Dense Plasma Focus Device," *SPIE Proc. On Emerging Lithographic Technologies III*, vol. 3676, 846-858 (Mar. 1999).

Pearlman and Riordan, "X-ray lithography using a pulsed plasma source," J. Vac. Sci. Technol., pp. 1190-1193 (Nov./Dec. 1981).

Porter, et al., "Demonstration of Population Inversion by Resonant Photopumping in a Neon Gas Cell Irradiated by a Sodium Z Pinch," *Phys. Rev. Let.*, 68(6):796-799, (Feb. 1992).

Price, Robert H., "X-Ray Microscopy using Grazing Incidence Reflection Optics," *Am. Inst. Phys.* , pp. 189-199, (1981).

Qi, et al., "Fluorescence in Mg IX emission at 48.340 Å from Mg pinch plasmas photopumped by Al XI line radiation at 48.338 Å," *The Am. Phys. Soc.*, 47(3):2253-2263 (Mar. 1993).

Scheuer, et al., "A Magnetically-Nozzled, Quasi-Steady, Multimegawatt, Coaxial Plasma Thruster," *IEEE: Transactions on Plasma Science*, 22(6) (Dec. 1994).

S. Schiemann et al., "Efficient temporal compression of coherent nanosecond pulses in a compact SBS generator-amplifier setup", IEEE J. QE 33, 358-366 (1997).

Schriever, et al., "Laser-produced lithium plasma as a narrow-band extended ulraviolet radiation source for photoelectron spectroscopy," *App. Optics*, 37(7):1243-1248, (Mar. 1998).

Schriever, et al., "Narrowband laser produced extreme ultraviolet sources adapted to silicon/molybdenum multilayer optics," *J. of App. Phys.*, 83(9):4566-4571, (May 1998).

Shiloh et al., "Z Pinch of a Gas Jet," Physical Review Lett., 40(8), pp. 515-518 (Feb. 20, 1978).

Silfvast, et al., "High-power plasma discharge source at 13.5 nm and 11.4 nm for EUV lithography," *SPIE*, vol. 3676:272-275, (Mar. 1999).

Silfvast, et al., "Lithium hydride capillary discharge creates x-ray plasma at 13.5 nanometers," *Laser Focus World*, p. 13. (Mar. 1997).

Stallings et al., "Imploding argon plasma experiments," Appl. Phys. Lett., 35(7), pp. 524-526 (Oct. 1, 1979).

Takahashi, E., et al., "KrF laser picosecond pulse source by stimulated scattering processes", Opt. Commun. 215, 163-167 (2003).

Takahashi, E., et al., "High-intensity short KrF laser-pulse generation by saturated amplification of truncated leading-edge pulse", Opt. Commun. 185, 431-437 (2000).

Tillack, et al., "Magnetic Confinement of an Expanding Laser-Produced Plasma", UC San Diego, Center for Energy Research, UCSD Report & Abramova—Tornado Trap.

Wilhein, et al., "A slit grating spectrography for quantitative soft x-ray spectroscopy," Am. Inst. Of Phys. Rev. of Sci. Instrum., 70(3):1694-1699, (Mar. 1999).

Wu, et al., "The vacuum Spark and Spherical Pinch X-ray/EUV Point Sources," *SPIE. Conf. On Emerging Tech. III*, Santa Clara, CA, vol. 3676:410-420, (Mar. 1999).

Zombeck, M.V., "Astrophysical Observations with High Resolution X-ray Telescope," *Am. Inst. Of Phys.*, pp. 200-209, (1981).

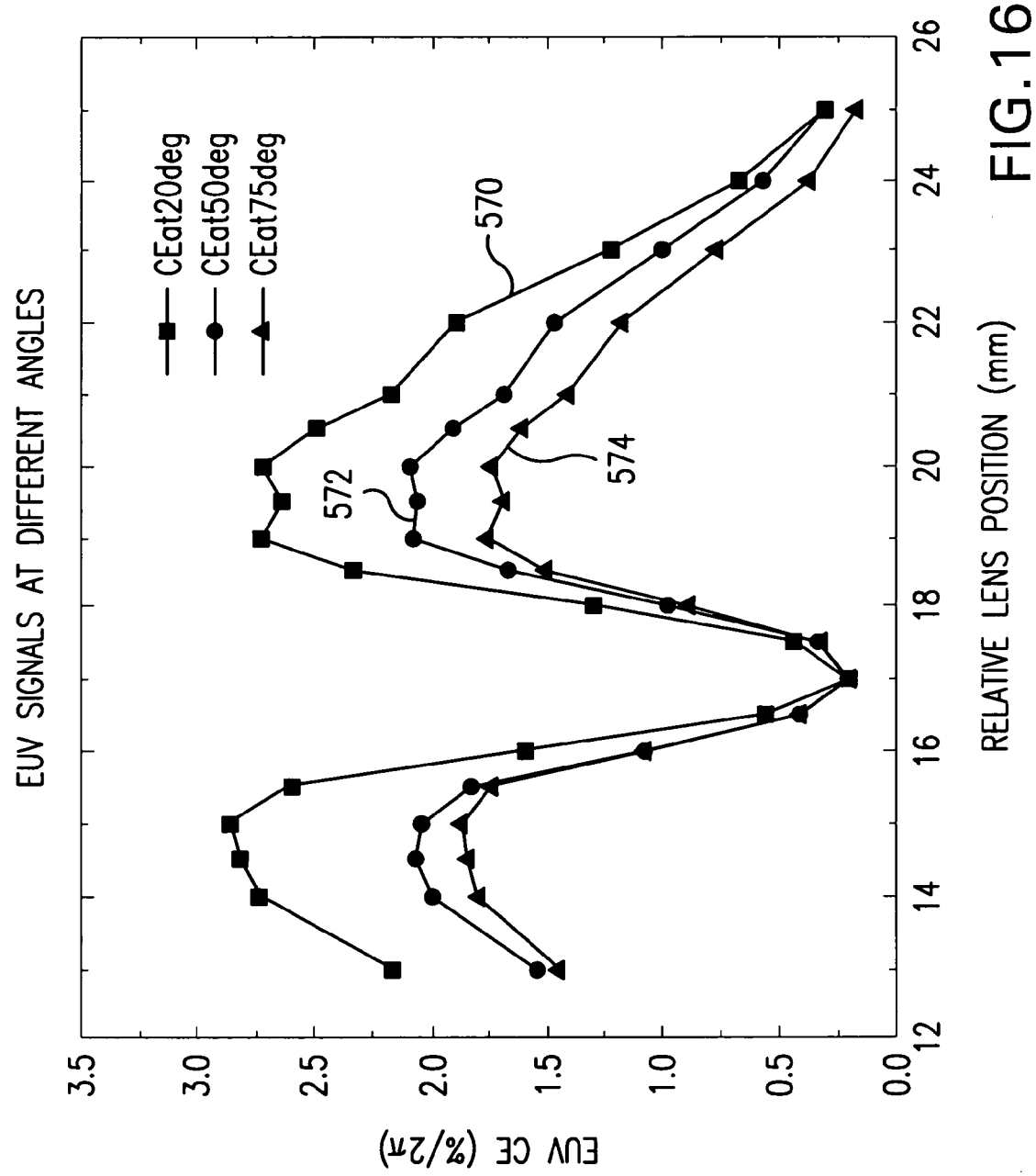

LPP EUV LIGHT SOURCE

RELATED APPLICATIONS

The present invention is as continuation in part of U.S. patent application Ser. No. 10/803,526, filed on Mar. 17, 2004, now U.S. Pat. No. 7,087,914 entitled, A HIGH REPETITION RATE LASER PRODUCED PLASMA EUV LIGHT SOURCE, which is assigned to the common assignee of the present application, the disclosure of which is hereby incorporated by reference. This application is related to U.S. patent application Ser. Nos. 10/409,254, entitled EXTREME ULTRAVIOLET LIGHT SOURCE, filed on Apr. 8, 2003, and 10/798,740, entitled COLLECTOR FOR EUV LIGHT SOURCE, filed on Mar. 10, 2004, and 10/615,321, entitled A DENSE PLASMA FOCUS RADIATION SOURCE, filed on Jul. 7, 2003, and 10/742,233, entitled DISCHARGE PRODUCED PLASMA EUV LIGHT SOURCE, filed on Dec. 18, 2003, and 10/442,544, entitled A DENSE PLASMA FOCUS RADIATION SOURCE, filed on May 21, 2003, and 10/900,836, entitled EUV LIGHT SOURCE, filed on Jul. 27, 2004, all co-pending and assigned to the common assignee of the present application, the disclosures of each of which are hereby incorporated by reference.

FIELD OF THE INVENTION

The present application relates to EUV light sources produced by a plasma initiated by irradiation of a target with a laser beam(s).

BACKGROUND OF THE INVENTION

Laser produced plasma EUV light sources have been under discussion for some time. The above referenced co-pending patent application discusses such LPP EUV lights sources and the background relating to them. Other co-pending applications assigned to the common assignee of the present invention also relate to aspects of DPP EUV light sources, including, U.S. patent application Ser. No. 10/798,740, entitled COLLECTOR FOR EUV LIGHT SOURCE, filed on Mar. 10, 2004, Ser. No. 10/900,839, entitled EUV LIGHT SOURCE, filed on Jul. 27, 2004, the disclosures of which are hereby incorporated by reference. The present application relates to improved drive lasers for a LPP EUV light source and improvements in delivering the laser irradiation to the plasma initiation target.

E. Takahashi et al., "KrF laser picosecond pulse source by stimulated scattering processes", Opt. Commun. 215, 163-167 (2003); K. Kuwahara et al., "Short-pulse generation by saturated KrF laser amplification of a steep Stokes pulse produced by two-step stimulated Brillouin scattering", J. Opt. Soc. Am. B 17, 1943-1947 (2000); R. Fedosejevs and A. A. Offenberger, "Subnanosecond pulses from a KrF Laser pumped $SF_6$ Brillouin Amplifier", IEEE J. QE 21, 1558-1562 (1985).

S. Schiemann et al., "Efficient temporal compression of coherent nanosecond pulses in a compact SBS generator-amplifier setup", IEEE J. QE 33, 358-366 (1997).

H. Nishioka et al., "UV saturable absorber for short-pulse KrF laser systems", Opt. Lett. 14, 692-694 (1989) and E. Takahashi et al., "High-intensity short KrF laser-pulse generation by saturated amplification of truncated leading-edge pulse", Opt. Commun. 185, 431-437 (2000) discuss various aspects of Brilluoin scattering and Stokes pulse production schemes that include the use of saturable absorbers but without apertures in SBS cells or the use of SBS amplifier cells. They do not teach or suggest, however, any optimization, e.g., of an energy conversion efficiency, e.g., for use in producing EUV light with short duration drive laser pulses. They also do not teach or suggest, e.g., the use of this method for a drive laser for laser-produced plasmas. Neshev, et al., "SBS Pulse Compression to 200 ps in a Compact Single Cell Setup," Appl. Phys., B 68 (1999), pp 671-675, discusses single cell and single cell plus an amplifier cell and Stokes pulse production for SBS.

H. Eichler, et al., "Phase conjugation for realizing lasers with diffraction limited beam quality and high average power," Technische Universitat Berlin, Optisches Institut, June 1998 web page, discusses:

phase conjugation by SBS (stimulated Brillouin scattering) is a powerfull and simple tool to increase the beam quality of high power lasers up to the diffraction limit. Master oscillator and power amplifier systems with Nd:YAIO as active medium were realized with an average output p0ower up to 210 Watts at 1.08 μm in near diffraction limited beam. Also Nd:YaG-oscillators with phase conjugating mirrors were realized with an average output power up to 17 Watt and high beam quality. In the UV range, excimer oscillators with SBS mirrors deliver the same or better beam quality than conventional plane-plane resonators in 3 times shorter pulses. Excimer oscillator-amplifier arrangements have been realized with SBS mirrors. SBS mirrors for the visible and ultraviolet spectral range are well characterized.

Phase conjugation by SBS is a powerful tool to increase the beam quality of high power solid state lasers up to the diffraction limit. Master oscillator and power amplifier syste3 ms with Nd:YAIO as active medium were realized. A simple single rod amplifier system was optimized to produce an average output power tunable from 4 up to 140 Watt with a beam quality of 1.1 times the diffraction limit. . . . Also Nd:YAG oscillators with phase conjugating mirrors were realized with an average output power up to 17 Watts and high beam quality.

In the UV range, excimer oscillators with SBS mirrors deliver the same or a somewhat better beam quality than conventional plane resonators in 3 times shorter pulses. Excimer oscillator amplifier arrangements have been developed with SBS mirrors. Improvement of the output beam quality requires the use of excimer amplifier discharges without amplitude distortions. SBS mirrors for the visible and ultraviolet spectral range are well characterized can be applied also to other laser types, e.g., Titanium:sapphire of Praseodymium lasers.

Tamper materials have been used in implosion systems and in LPP experiments [In what ways and for what purposes? With droplet targets?] and in inertial confinement fusion, but not as applicants presently propose for LPP EUV light production and specifically for improved CE in such applications.

The performance of a fiber amplifiers, e.g., a compact multimode pumped erbium-doped phosphate fiber amplifiers is discussed in Shibin Jiang, et al., "Compact multimode pumped erbium-doped phosphate fiber amplifiers," Optical Engineering, Vol. 42, Issue 10 (October 2003), pp. 2817-2820. A fiber amplifier with a small signal net gain of 41 dB at 1535 nm and 21 dB over the full C-band, using an 8-cm-long erbium-doped phosphate fiber excited with a 1-W, 975-nm multimode laser diode is discussed. A theoretical model for the multimode pumped amplifier based on modified rate equations and an effective beam propagation method are also discussed. Also see http://www.npphotonics.com/files/oaa_2002.pdf. Michael R. Lange, et al., "High gain coefficient phosphate glass fiber amplifier," NFOEC 2003, paper no. 126, also discusses phosphate glass material, with its high solubility for rare earth ions, is an attractive host candidate and explores the physical and dimensional parametrics associated with rare earth doped phosphate glass host material for the purpose of determining its benefits, limitations, and suitability as a compact gain media.

Efficient EUV generation using, e.g., molecular fluorine or excimer gas discharge lasers, e.g., a KrF excimer laser may require giving away significant power output, even from a MOPA arrangement, in order to satisfy requirements for short pulse duration for the LPP EUV light source drive laser. Such laser pulsed may be required to be on the order of perhaps as low as 2-3 ns FWHM, but most likely at least no larger than about 5-6 ns. Because, e.g., the KrF excimer laser has an upper state KrF* of the KrF laser transition on the order of 12 ns, it is difficult to get an output pulse of such short duration and in fact difficult to get much below 15-20 ns with state of the art KrF gas discharge lasers, without having to tolerate a significant loss in output power.

Applicants propose a solution to the above addressed problems and applications of noted existing technologies for the improvement of the production of EUV light by laser produced plasma techniques.

SUMMARY OF THE INVENTION

An apparatus and method is described for effectively and efficiently providing plasma irradiation laser light pulses in an LPP EUV light source which may comprise a laser initial target irradiation pulse generating mechanism irradiating a plasma initiation target with an initial target irradiation pulse to form an EUV generating plasma having an emission region emitting in-band EUV light; a laser plasma irradiation pulse generating mechanism irradiating the plasma with a plasma irradiation pulse after the initial target irradiation pulse so as to compress emission material in the plasma toward the emission region of the plasma. The plasma irradiation pulse may comprise a laser pulse having a wavelength that is sufficiently longer than a wavelength of the initial target irradiation pulse to have an associated lower critical density resulting in absorption occurring within the plasma in a region of the plasma defined by the wavelength of the plasma irradiation pulse sufficiently separated from an initial target irradiation site to achieve compression of the emission material, and the may compress the emission region. The laser plasma irradiation pulse may produce an aerial mass density in the ablating cloud of the plasma sufficient to confine the favorably emitting plasma for increased conversion efficiency. The deposition region for the plasma irradiation pulse may be is removed enough from the initial target surface so as to insure compression of the favorably emitting plasma. A high conversion efficiency laser produced plasma extreme ultraviolet ("EUV") light source may comprise a laser initial target irradiation pulse generating mechanism irradiating a plasma initiation target with a target irradiation pulse to form an EUV generating plasma emitting in-band EUV light; a plasma tamper substantially surrounding the plasma to constrain the expansion of the plasma. The tamper may comprises a material substantially transparent to EUV light within a selected band of EUV wavelengths, e.g., a buffer gas, or a coating on the target, e.g., a column of gas around the target, with the target being a metal droplet. The tamper may constrain expansion of the target after irradiation by transfer of momentum to the tamper material. A laser produced plasma ("LPP") extreme ultraviolet ("EUV") light source may comprise a drive laser; a drive laser pulse duration compression mechanism comprising: a Brillouin scattering cell, e.g., a stimulated Brillouin scattering cell, which may be seeded by a line narrowed master oscillator laser, e.g., a gas discharge laser. The Brillouin scattering cell may comprise a stimulated Brillouin scattering generator cell and a stimulated Brillouin scattering amplifier cell. The Brillouin scattering cell may comprise a first Brillouin scattering cell; a second Brillouin scattering cell seeded by the output of the first Brillouin scattering cell; a multipass amplifier amplifying the output of the second Brillouin scattering cell. A gas discharge power oscillator system may comprise: a gas discharge laser system having a resonant oscillator cavity formed by an output coupler partially reflective at the selected output wavelength $\lambda_3$ and a fully reflective mirror for the selected wavelength $\lambda_3$; an external seed beam introduced into the cavity through the nonreflective side of the fully reflective mirror comprising at least two wavelengths $\lambda_1$ and $\lambda_2$; a non-linear optical element within the cavity operative to convert the seed beam into an intracavity seed beam at the selected wavelength for amplification in the cavity. The resonant oscillator cavity may form a power amplifier; and the non-reflective side of the fully reflective mirror may provide a wavelength coupling of the external seed beam into the cavity. The resonant oscillator cavity may comprise a gas discharge halogen gas pulsed laser system. the values of $\lambda_1$ and $\lambda_2$ may being selected to produce in the non-linear optical element an output $\lambda_3$ suitable for seeding the laser in the oscillator cavity for amplification in a gain medium selected from the group of KrF, XeF and XeCl to produce a drive laser system laser output light pulse centered substantially at $\lambda_3$. A high conversion efficiency laser produced plasma extreme ultraviolet ("EUV") light source utilizing a pulsed laser beam to irradiate a plasma initiation target, may comprise a laser output light pulse beam source, producing laser output light pulses at a selected pulse repetition rate and having a pulse duration due to the characteristics of the operation of the output light pulse beam source that is not short enough form obtaining a desired EUV conversion efficiency; a power amplifier laser system; a pulse duration shortener comprising: a selection mechanism selecting a first selected portion of an output light pulse produced in the output light pulse beam source and directing the first selected portion through the power amplifier while an amplifying medium is present in the power amplifier, and for selecting a second portion of the output light pulse produced in the output light pulse beam source and directing the second selected portion through the power amplifier while the amplifying medium is present in the power amplifier; a combining mechanism substantially overlapping the first and second portions to form a combined beam to irradiate the target having a pulse duration short enough for producing the desired conversion efficiency. The combined beam may have substantially one half of the pulse duration as the laser output beam pulse produced by the laser output light pulse beam source and containing substantially all of the energy contained in the laser output light pulse produced by the laser output light pulse source. The laser output light pulse source may comprise a molecular or excimer gas discharge laser oscillator with an output pulse duration determined at least in part by the transition states of at least one the constituent of the lasing medium. The selection mechanism may comprise a pulse chopper separating the laser output light pulse into a first portion comprising substantially one half of the energy in the laser output light pulse and a second portion comprising substantially the other half of the energy in the laser output light pulse. The combining mechanism may comprise a first optical path and a second optical path the second optical path having a delay sufficient to substantially overlap the first portion and the second portion at the output of the first and second optical paths. The selection mechanism may comprise a first actuated optical element actuated to select the first selected portion and a second actuated optical element actuated to select the second selected portion. The first and second actuated optical elements may comprise electrically actuated optical elements operative to change the polarization, respectively, of the first selected portion and the second selected portion, which may further comprise: a first polarization specific reflective element in the path between the first actuated optical element and the power amplifier and a second polarization specific reflective element in the path between the second actuated optical element and the power amplifier. A laser produced plasma EUV light source may comprise a solid state pulsed laser producing laser output light pulses at a selected wavelength of about 1054 nm; a solid state amplifier mechanism comprising a fiber amplifier and a diode pumped solid state amplifier laser amplifying the laser output laser pulses from the solid state pulse laser; a harmonic generator converting the amplified laser output light pulses to a wavelength of about 351 nm; a XeF excimer laser amplifier chamber with a XeF excimer laser gain medium amplifying the amplified laser output pulses at about 351 nm to produce LPP EUV light source drive laser system output light pulses. The solid state seed laser may comprise a paramagnetic ion laser based upon an $Nd^{3+}$ ion operating in a band of center wavelengths from about 1051.2 nm to 1053.8 nm. The solid state seed laser is selected from a group comprising: Nd: (Y, Nd)$P_5O_{14}$ (1051.2 nm), $NdP_5O_{14}$ (1051.3 nm, Y $P_5O_{14}$ (1051.5 nm), Nd $P_5O_{14}$ (1051.5 nm), (Nd,La) $P_5O_{14}$ (1052 nm), KNd $P_4O_{12}$ (1052 nm), $K_5Ndi_2F_{10}$(1052 nm), $Y_3Al_5O_{12}$ (1052 nm), $BaF_2$—$YF_3$ (1052.1 nm), $Y_3Al_5O_{12}$ (1052.1 nm); Nd $P_5O_{14}$ (1052.1 nm), $YF_3$ (1052.1 nmk), $LaF_3$ (1052.3 nm), $YP_5O_{14}$ (1052.5 nm), $BaF_2$—$GdF_3$ (1052.6 nm), $SrF_2$—$GdF_3$ (1052.8 nm), $LiYF_4$ (1052.8 nm), Nd $P_5O_{14}$ (1052.9 nm), $BaY_2F_8$ (1-52.9 nm), $LiLuF_4$ (1052.9 nm), $LiYF_4$ (1053 nm), (Nd,La) $P_5O_{14}$ (1053 nm), $Ca_3(Nb,Ga)_2Ga_3O_{12}$ (1053-1062 nm), $LiYF_4$ (1053 nm), $BaF_2YF_8$ (1053 nm), $CaF_2$-$uF_3$ (1053 nm), $LaMgAl_{11}O_{19}$ (1053-1059 nm), $LiLuF_4$ (1053.1 nm), $LiKYF_8$ (1053.2 nm), $BaF_2$—$LaF_3$ (1054-1056.3 nm), $Lu_xAl_5O_{12}$ (1053.5 nm), $CaF_2$—$SrF_2$—$BaF_2$—$YF_3$—$LaF_3$ (1053.5-1054.7 nm), $CaF_2$—$CeF_3$ (1053.7 nm), and $BaF_2$—$LaF_3$ 1053.8 nm) lasers. The fiber amplifier may comprise a phosphate fiber amplifier and the solid state amplifier an Nd:phosphate laser. The apparatus may also comprise a tuning mechanism to tune the output of the solid state seed laser to maximize the effectiveness of the lasing in the XeF excimer amplifier chamber. The tuning mechanism may adjust the temperature of the solid state seed laser. A laser produced plasma EUV light source may comprise a four pass gas discharge laser amplifier chamber comprising: a first polarization sensitive beam splitter receiving a linearly polarized input laser light pulse beam for amplification and passing the input laser light pulse beam along a first optical path in a first direction; a first fully reflective mirror at the terminus of the first optical path reflecting the input laser light pulse beam back along the first optical path in a second direction; a polarization modification mechanism in the first optical path intermediate the first beam splitter and first fully reflective mirror operative to rotate the polarization of the pulses in the input laser light pulse beam by 90° by passage through the polarization modification mechanism in the first and second directions along the first optical path; the first polarization sensitive beam splitting mechanism operative to reflect the input laser light pulse beam traveling along the first optical path in the second direction along a second optical path; a second polarization sensitive beam splitting mechanism at a terminus of the second optical path and operative to reflect the input laser light pulse beam along a third optical path in a first direction; a second fully reflective mirror at the terminus of the third optical path reflecting the input laser light pulse beam back along the third optical path in a second direction; a polarization modification mechanism in the third optical path intermediate the second beam splitter and second fully reflective mirror operative to rotate the polarization of the pulses in the input laser light pulse beam by 90° by passage through the polarization modification mechanism in the first and second directions along the second optical path; the second polarization sensitive beam splitter operative to pass the input light laser pulse beam received along the third optical path in the second direction as an amplified output laser light pulse beam; the first and third optical paths intersecting within the gas discharge laser amplifier chamber. An LPP EUV light source drive laser system may comprise: a solid state oscillator laser having an oscillator laser output light pulse beam wavelength at about 1054 nm; a wavelength modification mechanism converting the wavelength of the oscillator laser output light beam to about 351 nm; at least one XeF excimer gas discharge amplifier chamber having a gain center at about 351 nm; a solid state oscillator laser output laser light pulse beam adjustment mechanism adjusting the output laser light beam wavelength to match the actual gain center of the XeF excimer gas discharge amplifier chamber. The at least one XeF excimer gas discharge amplifier chamber may comprise a first and a second chamber; a beam splitter directing a first portion of the oscillator laser output light pulse beam into the first chamber and a second portion of the oscillator laser output light pulse beam into the second chamber; a beam combiner combining the a first amplified output laser light pulse beam from the first chamber with a second amplified output laser light pulse beam from the second chamber into an LPP EUV light source drive laser output light pulse beam. The oscillator laser output light pulse beam may make at least three passes through the at least one XeF excimer gas discharge chamber through a gain medium contained in the at least one XeF excimer gas discharge laser chamber. A high conversion efficiency LPP EUV light source may comprise a laser target irradiation pulse generating mechanism simultaneously irradiating a plasma initiation target with at least two drive laser target irradiation pulses at different wavelengths. The at least two target irradiation pulses may comprise at least a first pulse at a first wavelength and a second pulse at a second wavelength longer than the first wavelength, with the second longer wavelength having an associated lower critical density than the first wavelength being absorbed less deeply within the target than the first wavelength. The plasma caused by absorption of the second pulse may compress the plasma formed by the second pulse. The plasma caused by the second pulse may cause ablation of target material toward the plasma formed by the first pulse to confine the plasma formed by the first pulse. The at least two pulses may comprise a single pulse containing at least the first and the second wavelength. An LPP EUV light source may comprise: at least one drive laser; a target for plasma initiation by irradiation by the drive laser; a plasma ambi-polar diffusion cancellation mechanism. The ambi-polar diffusion cancellation mechanism may comprises a negative electric field generator, which may impart to the target a negative electric field, e.g., as a portion of a target delivery mechanism, e.g., delivering liquid metal droplets.

BRIEF DESCRIPTION OF THE DRAWINGS

FIG. 16 shows EUV Ce for different angles;

DETAILED DESCRIPTION OF PREFERRED EMBODIMENTS

Figure 1:
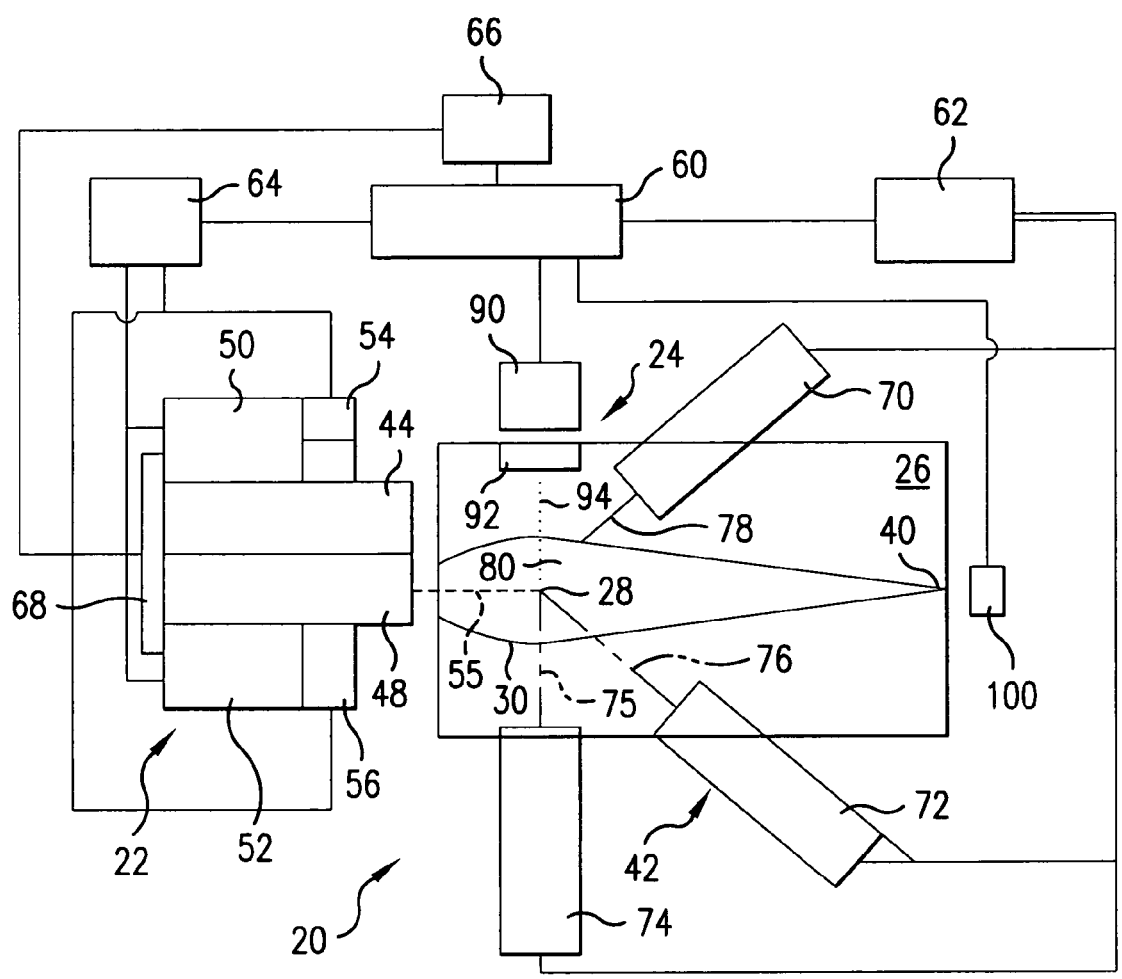
FIG. 1 shows schematically a basic block diagram of an EUV light source in which aspects of embodiments of the present invention may be utilized.

Turning now to FIG. 1 there is shown a schematic view of an overall broad conception for an EUV light source, e.g., a laser produced plasma EUV light source 20 according to an aspect of the present invention. The light source 20 may contain a pulsed laser system 22, e.g., a gas discharge excimer or molecular fluorine laser operating at high power and high pulse repetition rate and may be a MOPA configured laser system, e.g., as shown in U.S. Pat. Nos. 6,625, 191, 6,549,551, and 6,567,450. The light source 20 may also include a target delivery system 24, e.g., delivering targets in the form of liquid droplets, solid particles or solid particles contained within liquid droplets. The targets may be delivered by the target delivery system 24, e.g., into the interior of a chamber 26 to an irradiation site 28, otherwise known as an ignition site or the sight of the fire ball, which is where irradiation by the laser causes the plasma to form from the target material. Embodiments of the target delivery system 24 are described in more detail below.

Laser pulses delivered from the pulsed laser system 22 along a laser optical axis 55 through a window (not shown) in the chamber 26 to the irradiation site, suitably focused, as discussed in more detail below in coordination with the arrival of a target produced by the target delivery system 24 to create an x-ray releasing plasma, having certain characteristics, including wavelength of the x-ray light produced, type and amount of debris released from the plasma during or after ignition, according to the material of the target.

The light source may also include a collector 30, e.g., a reflector, e.g., in the form of a truncated ellipse, with an aperture for the laser light to enter to the irradiation site 28. Embodiments of the collector system are described in more detail below. The collector 30 may be, e.g., an elliptical mirror that has a first focus at the plasma initiation site 28 and a second focus at the so-called intermediate point 40 (also called the intermediate focus 40) where the EUV light is output from the light source and input to, e.g., an integrated circuit lithography tool (not shown). The system 20 may also include a target position detection system 42. The pulsed system 22 may include, e.g., a master oscillator-power amplifier ("MOPA") configured dual chambered gas discharge laser system having, e.g., an oscillator laser system 44 and an amplifier laser system 48, with, e.g., a magnetic reactor-switched pulse compression and timing circuit 50 for the oscillator laser system 44 and a magnetic reactor-switched pulse compression and timing circuit 52 for the amplifier laser system 48, along with a pulse power timing monitoring system 54 for the oscillator laser system 44 and a pulse power timing monitoring system 56 for the amplifier laser system 48. The system 20 may also include an EUV light source controller system 60, which may also include, e.g., a target position detection feedback system 62 and a firing control system 64, along with, e.g., a laser beam positioning system 66.

The target position detection system 42 may include a plurality of droplet imagers 70, 72 and 74 that provide input relative to the position of a target droplet, e.g., relative to the plasma initiation site and provide these inputs to the target position detection feedback system, which can, e.g., compute a target position and trajectory, from which a target error can be computed, if not on a droplet by droplet basis then on average, which is then provided as an input to the system controller 60, which can, e.g., provide a laser position and direction correction signal, e.g., to the laser beam positioning system 66 that the laser beam positioning system can use, e.g., to control the position and direction of he laser position and direction changer 68, e.g., to change the focus point of the laser beam to a different ignition point 28.

The imager 72 may, e.g., be aimed along an imaging line 75, e.g., aligned with a desired trajectory path of a target droplet 94 from the target delivery mechanism 92 to the desired plasma initiation site 28 and the imagers 74 and 76 may, e.g., be aimed along intersecting imaging lines 76 and 78 that intersect, e.g., alone the desired trajectory path at some point 80 along the path before the desired ignition site 28.

The target delivery control system 90, in response to a signal from the system controller 60 may, e.g., modify the release point of the target droplets 94 as released by the target delivery mechanism 92 to correct for errors in the target droplets arriving at the desired plasma initiation site 28.

An EUV light source detector 100 at or near the intermediate focus 40 may also provide feedback to the system controller 60 that can be, e.g., indicative of the errors in such things as the timing and focus of the laser pulses to properly intercept the target droplets in the right place and time for effective and efficient LPP EUV light production.

Figure 2:
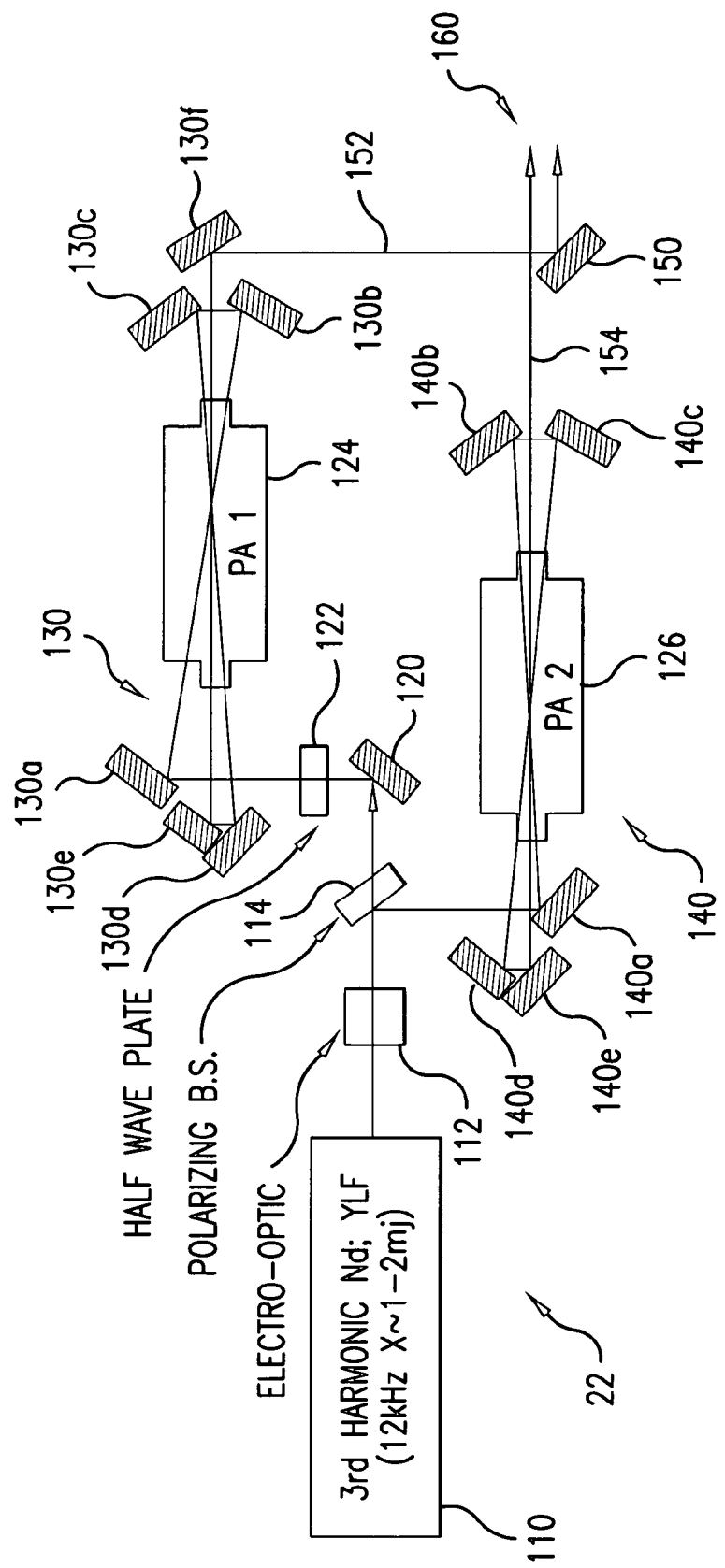
FIG. 2 shows schematically a basic block diagram of a 3rd harmonic Nd:YLF MO laser as the seed laser for a pair of PA lasers in an LPP drive laser system according to aspects of an embodiment of the present invention.

Turning now to FIG. 2 there is shown schematically a basic block diagram of a 3rd harmonic Nd:YLF MO and XeF gas discharge excimer laser as the PA LPP drive laser system according to aspects of an embodiment of the present invention. Applicants have found that a high power XeF excimer gas discharge laser can be an effective high repetition rate, e.g., around 6-12 kHz LPP EUV light source drive laser, meeting the requirements of such a laser for metal targets, e.g., droplets, e.g., of lithium or tin. This also requires, however a reliable production worthy pulsed seed laser with about 1 mJ per pulse and high mode quality. Applicants have determined that the 3rd harmonic of the Nd:YLF laser, which has nearly the same wavelength as the XeF laser can effectively serve as such a seed laser, that will permit good extraction efficiency from a minimum of two passes through the XeF amplifier laser chamber while maintaining high mode quality, in a MOPA configuration with the Nd:YLF laser as the MO and the excimer gas discharge XeF laser as the PA.

The third harmonic of the Nd:YLF laser may be created through two non-linear processes. First, the fundamental wavelength, ~1053 nm, may be doubled by one crystal to ~526.5 nm. These two wavelengths may then be mixed in a second crystal to form the third harmonic, ~351 nm, as is discussed, e.g., on the Photonics Industries web site. The output from the 3rd harmonic Nd:YLF is then passed through the XeF discharge chamber. A triple pass arrangement as shown in FIG. 2 may be required to achieve full extraction of the XeF gain. The wavelength difference between the 3rd harmonic Nd:YLF and XeF gain has been measured to be approximately 0.12 nm. A temperature shift of the third harmonic output, with a coefficient of 0.003 nm/° C. can be utilized to shift the 3rd harmonic Nd:YLF output to match the center of the XeF gain with a required temperature increase of only about 40.5 C required. The spectra of the XeF gain, 3rd harmonic Nd:YLF, and the amplified 3rd harmonic Nd:YLF are shown in FIG. 6.

Figure 6:
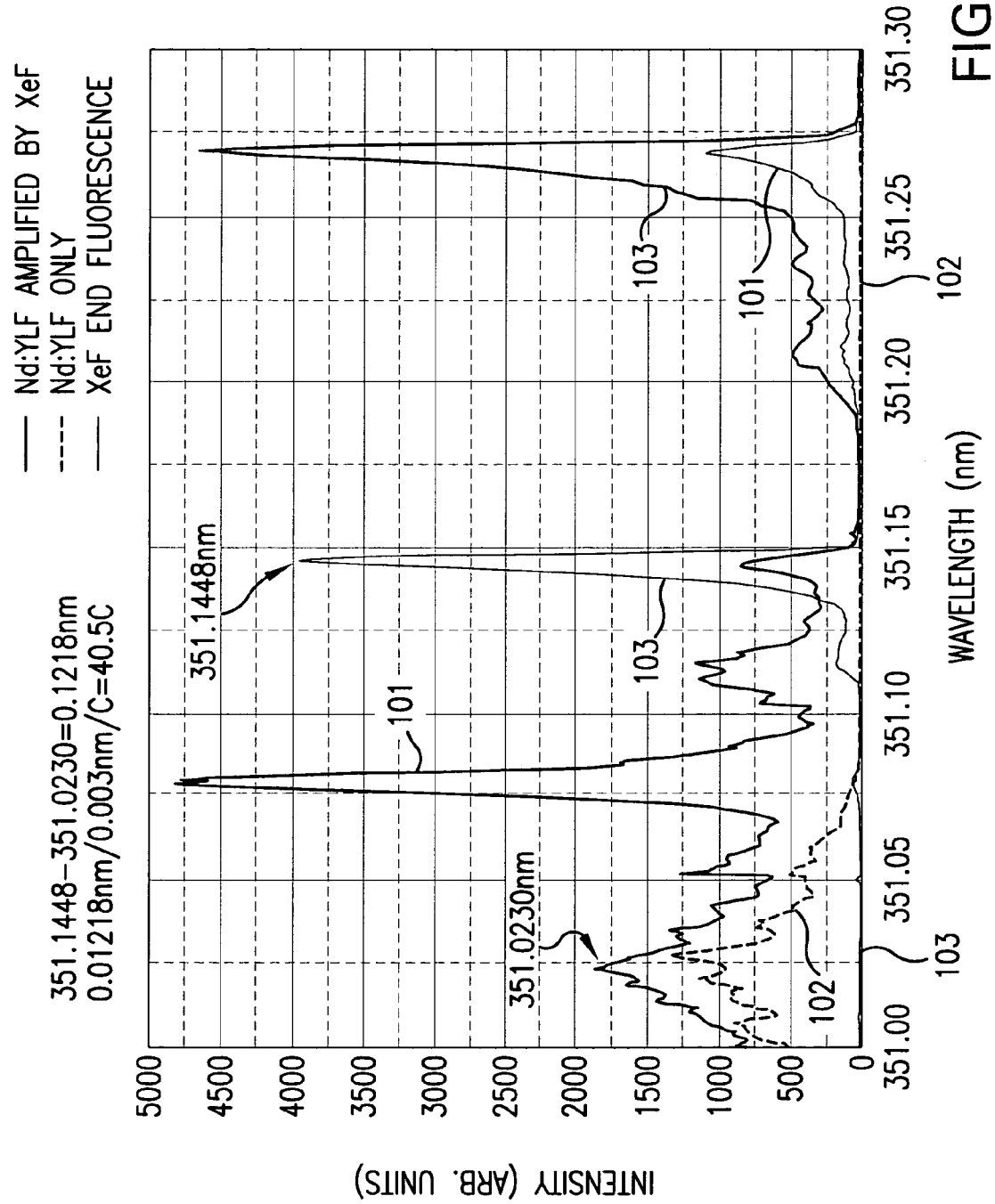
FIG. 6 shows various spectra pertinent to aspects of an embodiment of the present invention.

Turning now to FIG. 6 there is shown a graph of a spectrum 101 of an Nd:YLF solid state seed laser amplified in a XeF excimer amplifier laser, a spectrum 102 of the output of the Nd;YLF seed laser only and a spectrum 103 of the XeF amplifier laser end fluence.

Turning now to FIG. 2 there is shown a MOPA drive laser system 22 according to aspects of an embodiment of the present invention. The system 22 may comprise a solid state Nd:YLF laser operating at, e.g., about 12 kHz with an output of about 1-2 mJ per pulse, the output of which is passed through a third harmonic generator 112 to form the third harmonic of the output of the Nd:YLF laser at about 1053 nm, i.e., about 351 nm. This solid state master oscillator laser output light pulse beam may then be passed through a polarizing beam splitter 114, which may pass a first portion of the MO output laser light pulse beam having a first polarization to a fully reflective mirror 120 which may reflect the first portion of the MO output laser light pulse beam through a half wave plate 122, which converts the polarization of the first portion of the MO output laser light pulse beam pulses to the opposite polarization, and then into an optical pass system for a first power amplifier system, e.g., the XeF excimer gas discharge laser power amplifier system chamber 124. The polarizing beam splitter 114 may also reflect the second portion of the MO output laser light pulse beam of a second polarization into an optical system 140 for a second power amplifier system, e.g., the XeF excimer gas discharge laser power amplifier system chamber 126.

Each of the multi-pass optical systems 130, 140, with its constituent set of fully reflective mirrors 130*a-e* and 140*a-e*, provide for three passes, respectively, of the first portion of the MO output laser light pulse beam through the XeF amplifier chamber 124 and the second portion of the MO output laser light pulse beam through the XeF amplifier chamber 126. The amplified XeF PA laser light pulse beam 152 from the XeF PA chamber 124 is reflected by a fully reflective mirror 130*f* to an output mirror 150 to be optically combined with the PA output laser light pulse beam 154 from the XeF amplifier chamber 126 to form an LPP EUV light source drive laser system output laser light pulse beam 160.

According to aspects of an embodiment of the present invention applicants propose a drive laser for an LPP EUV light source that produces short duration excimer laser pulses, e.g., a KrF excimer laser at 248 nm wavelength or an XeF excimer laser at 351 nm, or an XeCl excimer laser at 308 nm, utilizing backward stimulated Brillouin scattering directly at the appropriate wavelength, by way of example the KrF wavelength of 248 nm. The above referenced articles discuss utilization of Brillouin scattering for reducing pulse duration, but not in the context of LPP driver lasers for producing EUV light. Applicants have discovered that an excimer laser, e.g., a line-narrowed excimer laser including a KrF or an ArF or a XeF line narrowed excimer laser, can be very well suited for this application and can be used as the seed laser for the LPP driver laser. Saturated multi-pass SBS amplification can be applied. This can eliminate the need for the use of YAG or other solid state seed lasers. According to aspects of an embodiment of the present invention a system that is more direct and easy to implement is proposed.

In order to achieve high conversion efficiencies (CE) for EUV radiation the laser pulse length (temporally, i.e., pulse width/pulse duration) has to be comparable to the characteristic target expansion time. However, the expansion time is often short compared to the laser pulse length. Therefore, LPP's can require either a means of target confinement or very short drive laser pulses (or both). Confinement schemes are difficult to introduce and likely to reduce the EUV light collection efficiency, since they can partially block the light path to the collector mirror 40 and thus reduce the total collection angle. If high laser energy can be delivered to the target in a short laser pulse, the use of a drive laser with sub-nanosecond pulse duration (or with a pulse duration of about 1 ns) may be the preferred scheme to reach high EUV conversion efficiency. It may also be preferred to have a short duration pulse as a pre-pulse, which begins the process of plasma formation followed by a laser irradiation pulse that imparts most of the energy to the expanding plasma for EUV Light generation.

According to aspects of an embodiment of the present invention, the excimer drive laser pulse length can be shortened to about 1 nanosecond or even less, to a few hundreds or a few tens of picoseconds. Backward stimulated Brillouin scattering (SBS) and truncated leading-edge amplification can be used according to aspects of an embodiment of the present invention for such purposes. The laser pulse length can be made to be short enough to achieve optimal coupling of the laser energy to the laser-produced plasma in spite of the expansion of the target material. The laser duration can be made comparable to the characteristic plasma expansion time. Therefore, the plasma does not expand much while the laser energy is applied, including in the instance where the pulse is a pre-pulse.

Thus, the highest possible laser-to-EUV conversion efficiency can be obtained. In addition to SBS, use of a multi-pass amplifier operated near saturation and additional (optional) saturable absorbers can lead to a further truncation of the laser pulse. Accordingly pulse widths, e.g., in the range of about 50 ps to 2000 ps can be achieved.

For effective and stable pulse shortening by stimulated Brillouin scattering the seed laser (oscillator) can, e.g., have a narrow spectral bandwidth and good focusability.

Figure 3A:
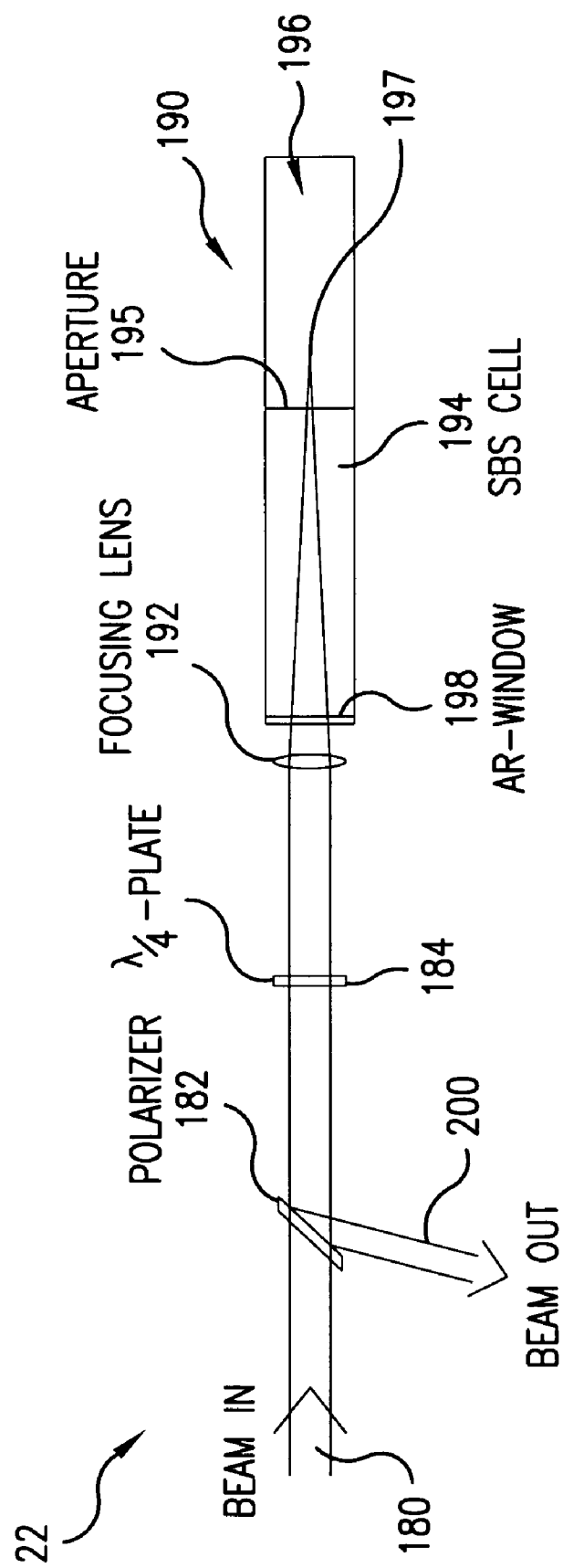
FIG. 3A is a schematic illustration of a stimulated Brillouin scattering ("SBS") cell arrangement useful in implementing aspects of an embodiment of the present invention.

Turning now to FIG. 3A there is shown an SBS cell useful in carrying out aspects of an embodiment of the present invention. A line-narrowed excimer laser, e.g., a KrF laser (not shown in FIG. 3A) can provide the required bandwidth features in an input laser beam 180. A spatial filter (260 shown in FIG. 12) and also apertures, e.g., apertures 195 in the SBS cells 190 located near the laser focus (as focused by focusing optics 192 in FIGS. 10-12) can provide additional spatial filtering with little loss of pulse energy. The use of liquids such as water, methanol, fluorinates or CCl4 for Stokes-pulse generation by SBS can also provide an efficient way to obtain pulse shortening.

Figure 3B:
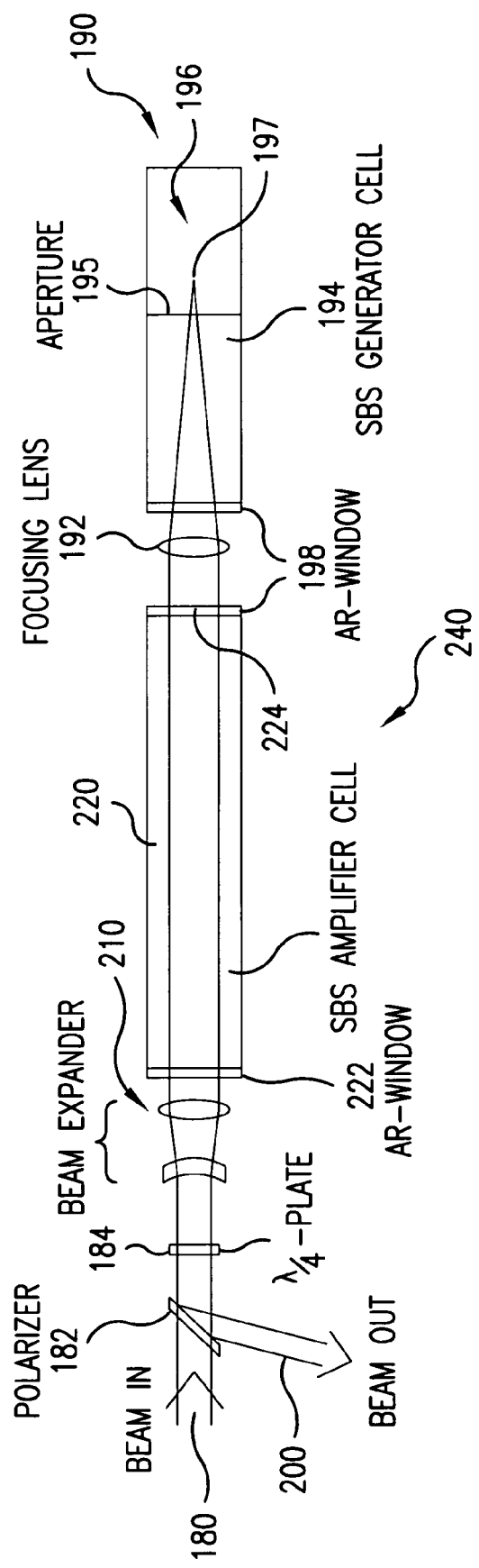
FIG. 3B shows schematically an SBS generator-amplifier arrangement useful in implementing aspects of an embodiment of the present invention; and, FIG. 4 shows schematically aspects of an embodiment of the present invention employing a multi-pass amplifier stage.

Turning now to FIG. 3B there is shown an arrangement useful according to aspects of an embodiment of the present invention for increased pulse shortening. As shown in FIG. 3B a two-step SBS scheme can be used, e.g., where a second SBS cell/mirror 190 can be located after the first amplification pass in an SBS amplifier cell 220. The bandwidth and gain duration of the amplifier cell 220 can be made sufficient for leading-edge saturated amplification, e.g., in a multi-pass (e.g., 4-pass) scheme. In principle, the pulse-shortening scheme according to aspects of an embodiment of the present invention can be applied not only to KrF lasers but also to other excimer lasers like XeCl, XeF or ArF lasers.

SBS Stokes pulse generation can be done with a configuration using a single-cell 190 or generator-amplifier SBS cell 190, 220 as shown, respectively, e.g., in FIGS. 3A and 3B respectively. The SBS cells 190 and 190, 220 can be either high-pressure gas cells using, e.g., $SF_6$, methane or $CCl_2F_2$, or, e.g., cells using liquids as a medium, which liquids may have a high breakdown threshold for UV radiation and a high optical transmittance, e.g., fluorinates, like FC-72 ($C_6F_{14}$) or FC-75 (a mixture of $C_8F_{18}$ and some $C_8F_{16}O$). The C—F bonding energy is higher than the KrF photon energy and the absorption at 248 nm is therefore very low. The Brillouin frequency of FC-72 is 4.9 GHz (Kuwahara et al.). For $SF_6$ at a pressure of 10 atm., it is only 0.53 GHz. The laser bandwidth should, e.g., be of similar magnitude or smaller. The laser line width of a laser system made by applicants' assignee, e.g., an ELS 7010 oscillator of 0.35 pm (FWHM) corresponds to 1.7 GHz. If needed, it can be narrowed further to below 1 GHz (0.21 pm) by use of either an intra- or an extra-cavity air-spaced Fabry-Perot etalon (not shown). The incident laser pulse energy can be, e.g., on the order of 10 mJ, with, e.g., a typical pulse rise time and pulse width of 5 ns and 15 ns (FWHM), respectively.

As shown in FIGS. 3A and 3B, the degree of linear polarization of the laser beam 180 can be increased further by insertion of a polarizer, e.g., a polarizing beam splitter 182. Linear polarization can then be converted to circular polarization by a quarter-wave plate 184. The laser beam 180 can then be focused through a focusing lens 192 and an anti-reflection coated window 198 into the SBS cell 190. An aperture 195 near the focus 197 can be used to improve the spatial beam properties. For pulse compression of an excimer laser operating at the B-x transition of XeF at 351 nm, water or methanol is also a suitable liquid for SBS generation. Near the focus 197 a Stokes beam is generated by non-linear processes. It is reflected by back scattering from the medium, i.e., the liquid or gas in the stimulated Brillouin scattering cell 190. This beam may also then be collimated by the focusing lens 192 and coupled out by the polarizer 182 forming an output beam 200.

A compact generator-amplifier system 240 (according to Schiemann et al.) can also be used alternatively as illustrated according to aspects of an embodiment of the present invention in FIG. 3B. By means of beam expansion optics 210, the laser beam 180 can be passed through an SBS amplifier 220 in front of the SBS generator cell 190. The reflected Stokes beam can then be amplified in the amplifier cell 220. The amplifier sell 220 may have anti-reflective coated windows 222 and 224.

A truncated leading-edge pulse can thereby be generated. Rise time and pulse width of the compressed SBS Stokes pulse can be on the order of between about 0.3 ns and 1 ns, depending on the particular laser bandwidth. Since the phonon lifetime of FC-72 is about 65 ps the pulse can be further shortened, e.g., after a pass through a molecular fluorine or excimer laser amplifier chamber, e.g., a power amplifier section 272, as shown, e.g., in FIG. 4 (by the first pass through the amplifier 272), into a second backward reflection SBS cell 190' (using, e.g., either FC-72 or $SF_6$) provided the excimer laser amplifier laser medium operating center wavelength is small enough. The conversion efficiencies of the SBS cells are on the order of or even larger than 50%. When anti-reflection coatings are used on all relevant optical surfaces, efficiencies exceeding 80% can be reached.

Figure 4:
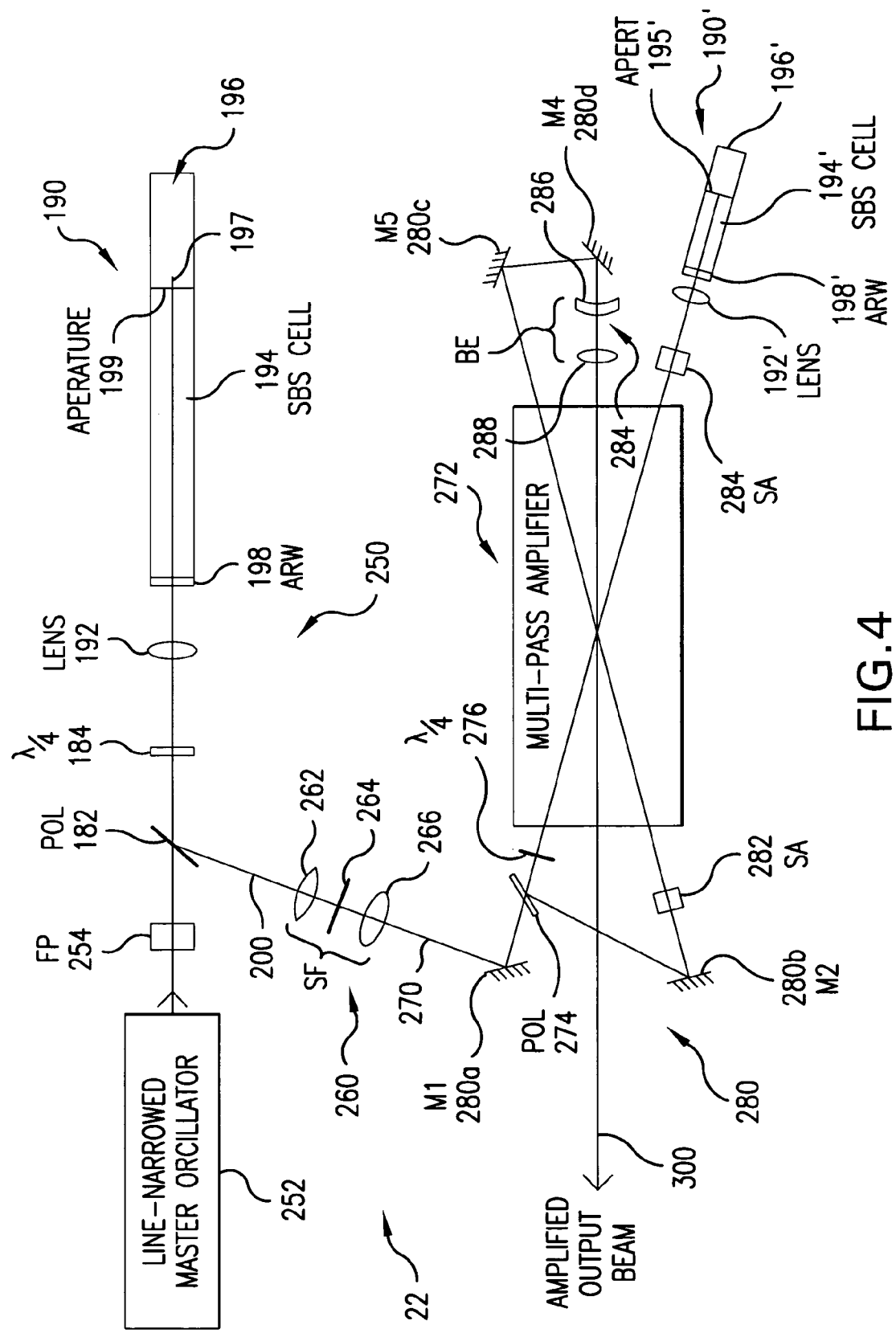
FIG. 4A shows schematically another embodiment of a four pass amplifier stage according to aspects of an embodiment of the present invention.
FIG. 4B shows schematically another embodiment of a seed laser for a PA of an LPP EUV drive laser system according to aspects of an embodiment of the present invention.

The generated SBS Stokes seed pulses may then be amplified in a multi-pass amplifier 272 with mirrors (M1-M4) 280a-d and polarizing beam splitter 274 providing the additional two passes through the amplifying medium within the amplifier section 272. FIG. 4 illustrates a, 4-pass configuration as an example.

The spatial properties of the laser output 300 may be improved, e.g., by insertion of a (optional) spatial filter (SF) 260, which may comprise, e.g., a focusing lens 262, a pinhole aperture 264 and a collimating lens 266. The pinhole aperture 264 in the spatial filter 260 and also the apertures 195 in the SBS cells 190, 190' can be, e.g., a small hole in a textured fused-silica substrate. After reflection from the second SBS cell 190' and another pass through the amplifier 272 the beam is reflected by the polarizer 274 and sent through the amplifier 272 once more utilizing, e.g., mirror M2 280a. A saturatable absorber (SA) 282, e.g., cuvettes using, e.g., a suitable concentration of acridine dissolved in methanol (see Nishioka et al.), can be inserted into the beam path in order to increase the pulse-to-prepulse (pedestal) contrast ratio and suppress amplified spontaneous emission. On the other hand, if the laser-to-EUV conversion efficiency is higher in the presence of a pre-pulse, then the pedestal due to amplified spontaneous emission may be chosen to not be attenuated as much in order to be effectively used as a pre-pulse. In other words, the concentration of the saturable absorber 282 in the cuvettes may, e.g., be adjusted to adjust the energy contained in the pre-pulse. Before the last pass through the amplifier 272, utilizing, e.g., mirrors M3, M4, 280c-d, the beam diameter may be preferentially expanded by use of beam expansion optics (BE) 284, which may comprise, e.g., a cylindrical lens 286 and a collimating lens 288. The saturated multi-pass amplification can thereby be used to make steeper the temporal pulse profile further, e.g., leading to a pulse shortening by about a factor of 2. According to aspects of embodiments of the present invention pulse widths of approx. 50 ps can be reached for the output pulse beam 300. Depending on the particular design (one or more SBS cells, saturable absorbers, etc.), an output pulse width can be achieved in the range of, e.g., 50 ps to 2000 ps.

The general scheme, truncated leading-edge seed-pulse generation by SBS and making the pulse steeper by saturated amplification, may also be realized by other configurations than the particular embodiment shown in FIG. 4.

Figure 4A:
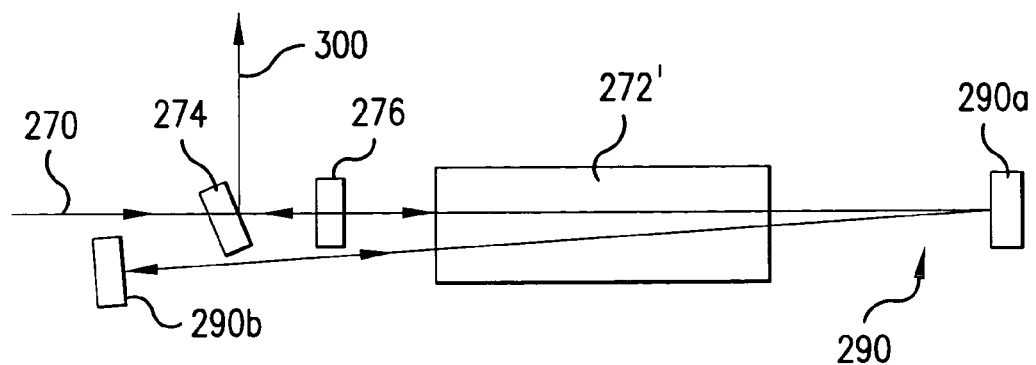

Turning now to FIG. 4A there is shown another embodiment of a four-pass amplifier section 272', which may, e.g., pass the input pulse 270 through a polarizing beam splitter 274, as in FIG. 4 and thence to a fully reflective mirror at the appropriate center wavelength 290a to be reflected to and from another fully reflective mirror 290b, for two additional passes through the amplifier medium within the amplifier section 272' and then reflected back to the polarizing beam splitter 274 for one additional pass through the section 272' and to be coupled out as output beam 300, having passed twice through quarter wave plate 276 to change the polarization to cause reflection off of the polarizing beam splitter 274.

Figure 8:
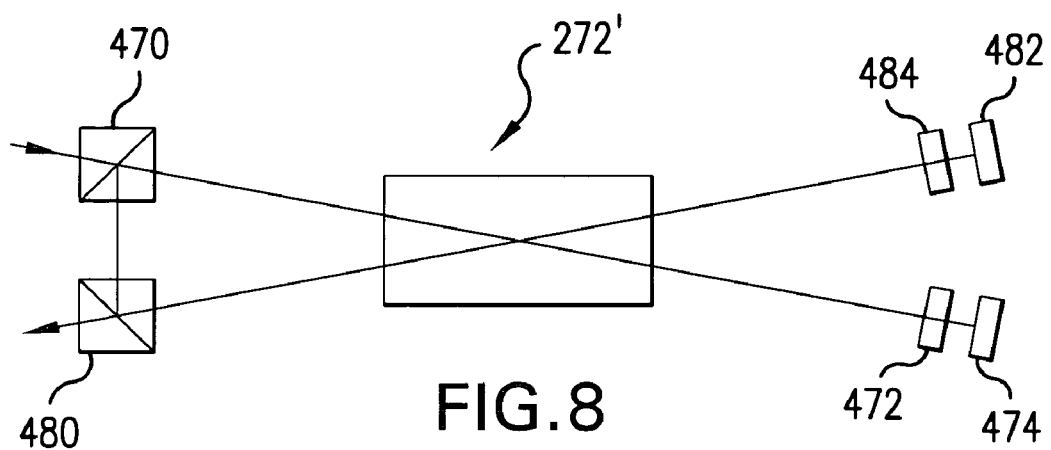
FIG. 8 shows schematically another four pass amplifier section according to aspects of an embodiment of the present invention.

Turning now to FIG. 8 there is shown another embodiment of a four pass amplifier section according to aspects of an embodiment of the present invention. The amplifier section 272' may have an optical system comprising in input polarizing beam splitter 470, a first fully reflective mirror 274 and associated half wave plate for convert the polarization of the beam reflectred back from the mirror 474 to the beam splitter 470, which then reflects the beam to a second polarizing beam splitter 480, which reflecte the beam to a second fully reflective mirror 482 and associated half wave plate for reflection back through the amplifier section 272' for the fourth time to be coupled out by the second polarizing beam splitter 480.

Figure 4B:
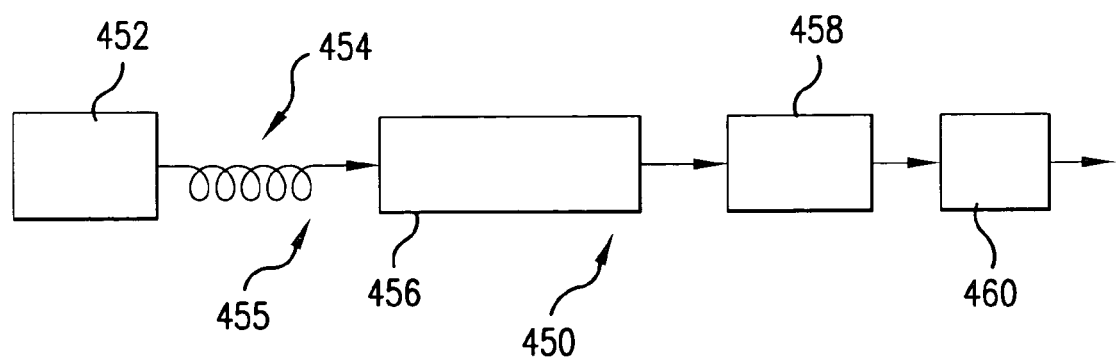

Turning now to FIG. 4B there is shown schematically a drive laser system 450 for a laser produced plasma EUV light source. The system 450 may include, e.g., a pulsed solid state seed laser 452, e.g., a parametric ion laser, e.g., a $Nd^+$ ion lasser, e.g., an $Nd:BaF_2$—$CeF_3$ laser operating at 1053.7 nm at, e.g., 10 kHz and with an output of, e.g.,_µJ per pulse, for a total of_J, i.e.,_W. This could also be any of a number of such solid state lasers all operating at around 1054 nm, e.g., a $Nd:BaF_2$—$LaF_3$, or any of a variety of such Nd: solid state lasers utilizing, e.g., the following hosts (sensitizer ions) (Y, Nd)$P_5O_{14}$ (1051.2 nm), $NdP_5O_{14}$ (1051.3 nm, Y $P_5O_{14}$ (1051.5 nm), Nd $P_5O_{14}$ (1051.5 nm), (Nd,La) $P_5O_{14}$ (1052 nm), KNd $P_4O_{12}$ (1052 nm), $K_5Ndi_2F_{10}$(1052 nm), $Y_3Al_5O_{12}$ (1052 nm), $BaF_2$—$YF_3$ (1052.1 nm), $Y_3Al_5O_{12}$ (1052.1 nm); Nd $P_5O_{14}$ (1052.1 nm), $YF_3$ (1052.1 nmk), $LaF_3$ (1052.3 nm), $YP_5O_{14}$ (1052.5 nm), $BaF_2$—$GdF_3$ (1052.6 nm), $SrF_2$—$GdF_3$ (1052.8 nm), $LiYF_4$ (1052.8 nm), Nd $P_5O_{14}$ (1052.9 nm), $BaY_2F_8$ (1-52.9 nm), $LiLuF_4$ (1052.9 nm), $LiYF_4$ (1053 nm), (Nd,La) $P_5O_{14}$ (1053 nm), $Ca_3(Nb,Ga)_2Ga_3O_{12}$ (1053-1062 nm), $LiYF_4$ (1053 nm), $BaF_2YF_8$ (1053 nm), $CaF_2$-$uF_3$ (1053 nm), $LaMgA_{11}O_{19}$ (1053-1059 nm), $LiLuF_4$ (1053.1 nm), $LiKYF_5$ (1053.2 nm), $BaF_2$—$LaF_3$ (1054-1056.3 nm), $Lu_3Al_5O_{12}$ (1053.5 nm), $CaF_2$—$SrF_2$—$BaF_2$—$YF_3$—$LaF_3$ (1053.5-1054.7 nm), $CaF_2$—$CeF_3$ (1053.7 nm), and $BaF_2$—$LaF_3$ 1053.8 nm).

The output of the solid state seed laser 452 may then be amplified, e.g., in a fiber amplifier 454, e.g., a phosphate fiber amplifier of the type mentioned above in the background of the invention, to a level of about several µJ per pulse, and the output of the fiber amplifier may be further amplified in another solid state laser amplifier, e.g., a phosphate glass amplifier, e.g., a Nd:phosphate glass amplifier, that may be diode pumped, producing and output of 200 µJ per pulse, for a total of $10^{-6}$ J, i.e.; 2 W as the input to a third harmonic generator 458, to produce, in the case of a $Nd:BaF_2$—$CeF_3$ or an $Nd:BaF_2$—$LaF_3$ solid state laser 452 initial input, 2 W at 351.2 nm. The phosphate glass amplifier may be, e.g., Nd:phosphate glass amplifier which is diode pumped.

In order to produce lasing in the amplifying medium of, e.g., a XeF excimer power amplifier stage 460, the initial wavelength of the solid state seed laser may have to be tuned slightly, e.g., by heating the crystal at a rate of a few pm/° C. Thus about an order of magnitude of temperature change is needed to tune the above referenced seed lasers as opposed to an Nd:YAg solid state laser that initially puts out light at 1064 nm.

Figure 5:
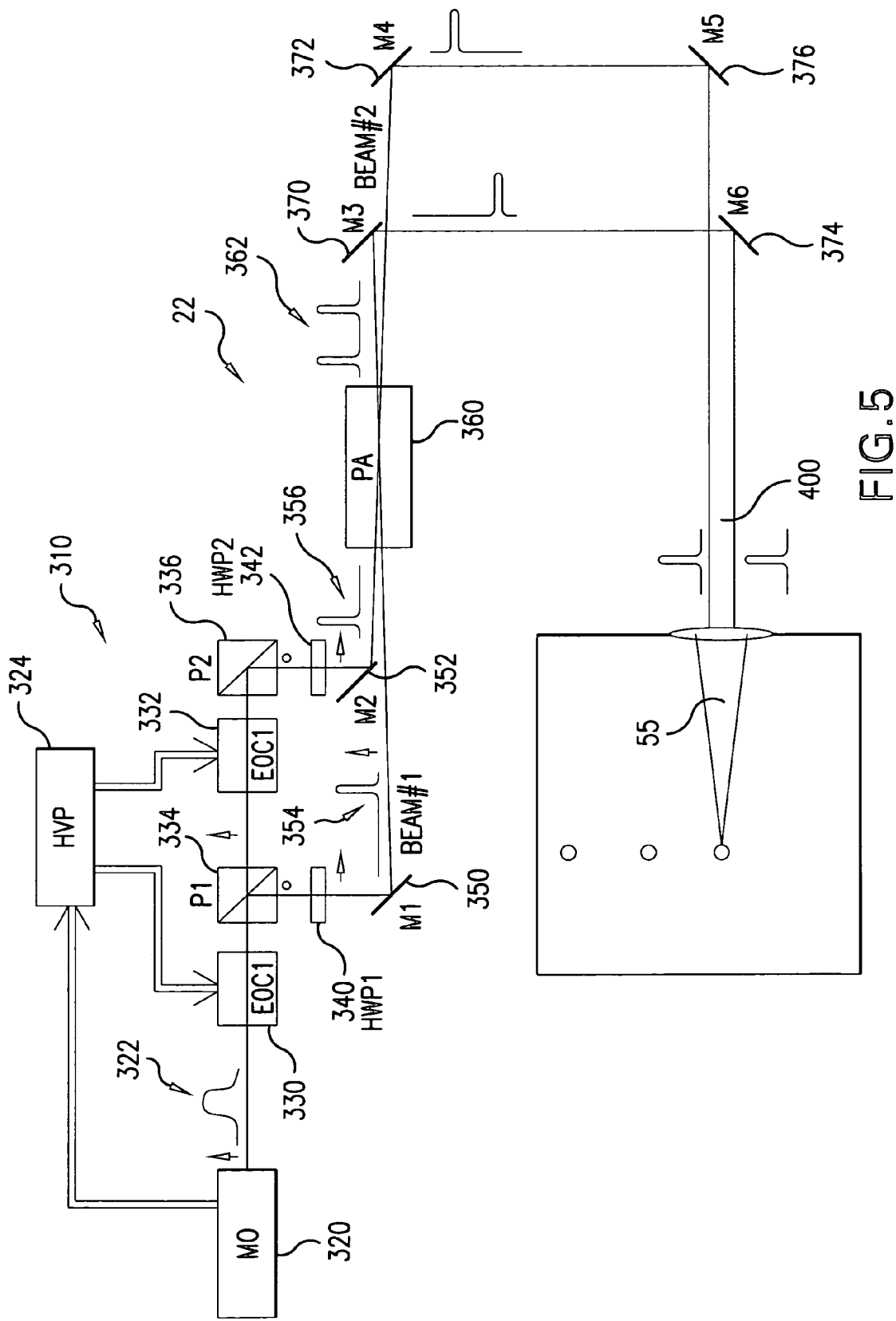
FIG. 5 shows schematically an EUV drive laser system with a pulse shortener according to aspects of an embodiment of the present invention.

Turning now to FIG. 5 there is shown an efficient short pulse drive laser system 22 for use as an LPP drive laser. Utilization of a high efficiency short pulse drive laser 22, e.g., a molecular fluorine or excimer gas discharge laser as the drive laser 22 can allow for high CE EUV light generation, e.g., with a CE on the order of about 2.5-3.5%. The drive laser system 22 may comprise, e.g., a pulse narrower 310 receiving the output pulse of a master oscillator 320 portion of the drive laser system, e.g., corresponding to the master oscillator section 44 illustrated schematically in FIG. 1. The output pulse 322 of the MO 320 may be relatively long in duration,e.g., about 12-15 ns, and may be shortened, e.g., in a pulse narrower 310, as explained below. It will be understood that the illustration of the pulse 322 is a temporal intensity distribution, such that the left hand side of the pulse is created in the MO 320 first in time (the front of the pulse) and the right hand side of the pulse 322 as illustrated is created last in time, i.e., the tail of the pulse.

The pulse narrower may comprise an electro-optical coupler for example made of a material, e.g., a beta-barium borate crystal, that will change the polarization of the light in pulse 322 due to the application of some stimulating field, in the case of an electro-optical coupler an electrical field (magneto- or acousto-optical couplers may also be used), e.g., in a rear portion of the pulse 322 (temporally), e.g., the back half of the pulse passing through the electro-optical coupler 330, such that this shorter pulse portion 354 is reflected in a polarizing beam splitter 334 and reflected through half wave plate 340 to be returned to its original polarity. The other portion of the pulse, the front half (temporally) of the pulse 322 which is not changed in polarity is passed to a second electro-optical coupler 332. The electro-optical coupler 332 changes the polarity of the front portion (temporally) of the pulse 322, which then is reflected in a second polarizing beam splitter 336 and passed through a second half wave plate to return it to its original polarity. These two shortened pulses 354, 356, which together make up essentially all of the energy output of the MO, split into two shorter pulses, may be so selected by the timing of the application of, e.g., an electrical field to the respective electro-optical couplers 330, 332, as selected by a timing circuit (not shown) as is well known in the art to provide a timed electrical pulses with a selected temporal separation, to drive a high voltage power supply, which may also be controlled responsive to the timing of the electrical pulse to the peaking capacitor in the MO 320 that causes the gas discharge in the MO, or responsive to a detection of fluorescence on the MO chamber or light out from the MO stage, all indicative of the temporal timing of the MO output pulse 322.

In this fashion each of the short duration pulses 354, from the tail of the pulse 322, and 342 from the front of the pulse 322 (temporally) can be passed through the power amplifier 360 gain medium by reflection, respectively from fully reflective mirrors 350 and 352, for amplification in the PA 360 and then passed through different delay lines, comprising, respectively, fully reflective mirrors 370 and 374 (the short delay route) and mirrors 372 and 376 (the long delay route, of about 10 ns longer travel time), so that at the input to the LPP chamber the beam 400 comprises two overlapping pulses of the same duration, which is half of that of the output pulse 322 from the MO but contains all of the pulse energy as was output from the MO in the pulse 322.

It will be understood that for, e.g., for a KrF MO the output pulse duration of pulse 322 may be on the order of at best about 15 ns, and splitting the pulse to form a single pulse of half that duration, i.e., about 7.5 ns, may not be as effective as a shorter duration pulse insofar as LPPEUV CE is concerned, but may be effective in some applications. For other gain media, e.g., XeCl or XeF, specifically, e.g., XeF, the pulse duration out of the MO stage may be on the order of 6-10 ns. In this event, the pulse splitting and recombination techniques describe above may be effective to obtain the 2-3 ns believed to be required, and at least down to about 5 ns, which recent study by applicants has revealed may also be effective enough for substantially improvement in LPP CE in producing EUV light.

According to aspects of an embodiment of the present invention applicants also propose to, e.g., utilize essentially all of the laser light at various harmonics, e.g., (1064, 532, 266 nm for a Nb:YAG solid state laser) for an LPP drive laser irradiating a target at the plasma initiation site, e.g., by injecting onto the target droplet 20 the different harmonics essentially at the same time, e.g., coaxially. As the different wavelengths will be absorbed at different positions within the target 20 and the subsequently forming plasma, the source emission will be extended along the incident beam(s) proportionally to the density scale length near the cutoff location. This scale length can also be varied by delaying the higher harmonics relative to the fundamental, by simple optical delay. Thus, the density gradient in an under dense region for higher harmonics, in decay after the initial pulse, can be varied. Thus, all of the laser energy can be employed in the LPP, suffering only absorption losses in frequency multiplication crystals, during harmonic generation, which can be kept at a relatively low level (a=0.1%/cm typical), while spreading out the absorption equivalent to a more shallow density gradient precisely controlled near the cutoff.

Alternatively, if the laser light from the fundamental beam is delayed relative to the higher harmonics, it can be used to improve conversion efficiency ("CE"), e.g., because it will impact the ablation cloud just outside the emission region, e.g., driving a compression pulse inward. This can increase the density within the radiating layer of the plasma and can increase the confinement time of the radiating ions. Both effects can improve the radiation properties and increase the conversion efficiency. Applicants have performed preliminary simulation modeling of the plasma fluid dynamics to support this proposed improvement to CE.

Applicants have studied the fluid dynamics of an LPP through simulations and the like and also the resultant emission dynamics and believe that conversion efficiency may be limited at least in part because only a very low mass density exists in the re-combining region favorable for in-band emission, thereby limiting the desirable in-band emission. To slow down the ablation and increase the mass density in the in-band emission region applicants propose to inject a second laser pulse after the initial ablation laser pulse utilizing a second so-called compression pulse having, e.g., a longer wavelength and thus an associated lower critical density so that absorption occurs at a position considerably farther away from the initial target surface. This pulse and its ablation of material can result in, e.g., an inward (toward the initial target surface) compression of the plasma emission materials. The compression pulse absorption, e.g., relatively fixed in location by its wavelength, can, e.g., be relatively precisely timed to compress the ablation cloud under it and much farther out from the emission region. In lieu of the above described use of, e.g., an Nd:YAG laser timed to shape the ablation cloud for more favorable conditions for emission, the present proposal more specifically aims at a shaping and a compression using, e.g., a $CO_2$ laser for the compression pulse. The deposition region for such a laser pulse can lie, e.g., substantially removed from the initial target surface so as to virtually guarantee compression of the emission region. Achieving this dynamic can result in a higher aerial mass density in the ablating cloud, essentially increasing confinement of the favorably, in band, emitting portion of the created plasma.

Figure 7:
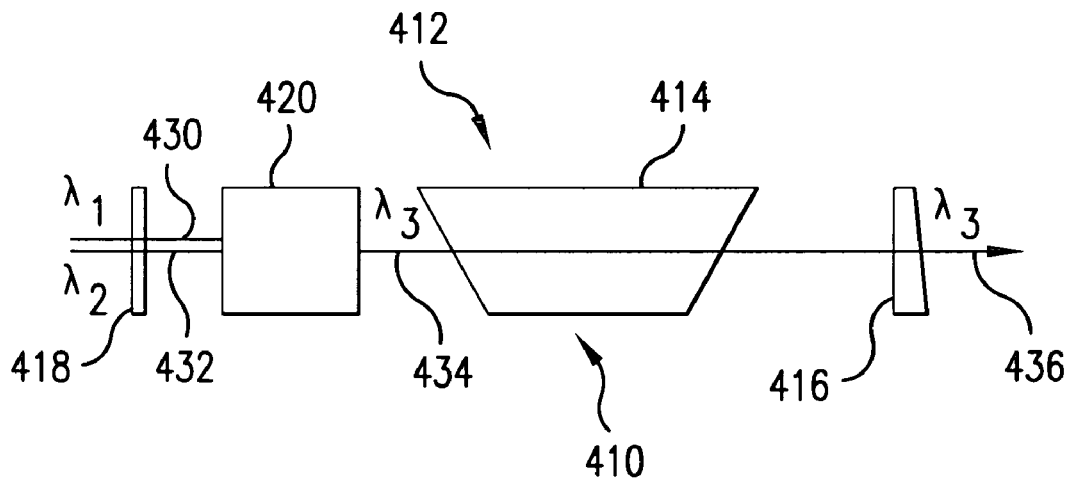
FIG. 7 shows schematically a wavelength coupled amplifier section for an LPP EUV light source operating as a power oscillator for amplification f the wavelength coupled seed laser light according to aspects of an embodiment of the present invention.

Turning now to FIG. 7 there is shown schematically a wavelength coupled multi-gain medium oscillator/amplifier drive laser 410 arrangement that significantly reduces coupling losses where the amplifier is in a power oscillator configuration. The system 410 receives a pair of pulses 430, 432 of different wavelengths $\lambda_1$ and $\lambda_2$ through a coupling optic 418 from a pair of seed lasers (not shown). The optical element 418 is selected to be highly transmissive to each of the wavelengths $\lambda_1$ and $\lambda_2$, while essentially maximally or fully reflective at a third wavelength $\lambda_3$ which also corresponds to the wavelength at the gain point of the amplifier laser comprising a 414, an output coupler 416 and the mirror surface of the optical element 418. The output coupler can be selected to be partly reflective, e.g., 20% reflective at the gain wavelength $\lambda_3$ and essentially fully reflective or maximally reflective for $\lambda_1$ and $\lambda_2$. For example, the amplifier laser could be an excimer gas discharge laser, e.g., a KrF or XeCl laser having, respectively a $\lambda_3$ or 248 nm and 308 nm. The two seed beams 430 and 432 are passed through an optical element within the cavity of the amplifier laser, e.g., a nonlinear crystal, e.g., a KD*P, or KDP, or KTP crystal, as appropriate for the wavelengths involved, that produces $\lambda_3$ according to a sum-frequency equation:

$$1/\lambda_1 + 1/\lambda_2 = 1/\lambda_3.$$

For example, for $\lambda_3 = 308$ nm one could use $\lambda_1$ of 532 nm, e.g., produced as the second harmonic of an Nd:YAG laser operating at 1064 nm and $\lambda_2$ produced from a Ti:Sapphire or alexandrite solid state laser operating at 731.5 nm, such that $1/\lambda_1 + 1/\lambda_2 = 1/\lambda_3$.translates to 0.00324675 nm≅0.00187969+ 0.00136705=0.00324674 to 8 decimal places. Similarly one could employ $\lambda_1$ of 924 nm (the fundamental of a Ti:sapphire solid state laser) and $\lambda_2 = 462$ (second harmonic of a Ti:sapphire laser such that $1/\lambda_1 + 1/\lambda_2 = 1/\lambda_3$.translates to 0.00324675=0.00108225+0.00216450 to eight decimal places. For a $\lambda 3$ of 248, one can use a $\lambda=1$ of 266 nm (fourth harmonic of a Nd:YAg solid state laser and $\lambda_2$ of 3664 from an OPO laser or $\lambda_1 = 744$ (the fundamental of a Ti:sapphire or alexandrite laser and $\lambda_2 = 372$ (second harmonic of a Ti:sapphire or alexandrite laser. It will be understood by those skilled in the art that that the Ti:sapphire or alexandrite laser si tunable through a range enabling the above fundamental and harmonic frequencies/wavelengths.

Applicants have considered ways to alter expansion dynamics in the LPP. According to aspects of an embodiment of the present invention applicants present ways to achieve higher conversion efficiency ("CE") from an LPP EUV light source, e.g., utilizing a metal target, e.g., lithium as the target, and also for example lithium in the form of liquid droplets. By constraining, even modestly, the ablation expansion in an LPP after initiation of the plasma by laser irradiation, the laser energy partitioned into kinetic energy can be delayed from escaping from the region of in-band EUV emission, sufficiently to allow the energy to escape as in-band EUV radiation. In the case of a metal, e.g., lithium target, e.g., a droplet, this can be sufficient to increase the conversion efficiency because there are so few other radiative transitions. Applicants propose that a material substantially transparent to visible and EUV radiation, which applicants call an expansion tamper, in the sense that its function is to tamper the expansion of the plasma, be placed in a location to effectively reduce expansion of at least a substantial portion of the plasma, e.g., the on the incident surface of the target material. This will have the effect of constraining the material expansion of the target material due to momentum transfer from the material of the plasma, e.g., unionized portions of the material expanding due to kinetic energy imparted to the material from laser irradiation and subsequent ablation of the target material, into the tamper. Such a material could be as simple as a background of helium or especially hydrogen, both of which are mostly transparent to EUV radiation and to the DUV of the irradiating laser beam(s).

Figure 9A:
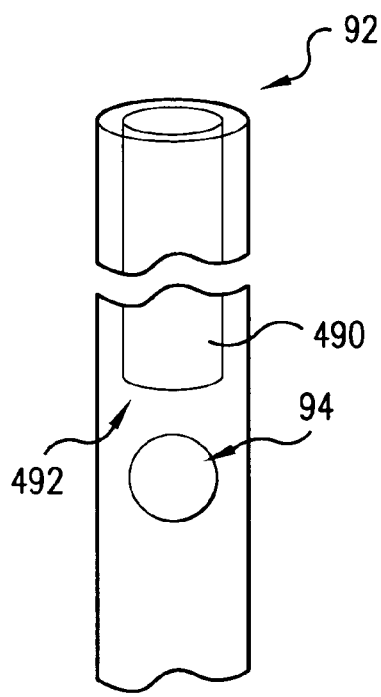
FIG. 9A shows schematically a tamper material formation mechanism according to aspects of an embodiment of the present invention.
Figure 9B:
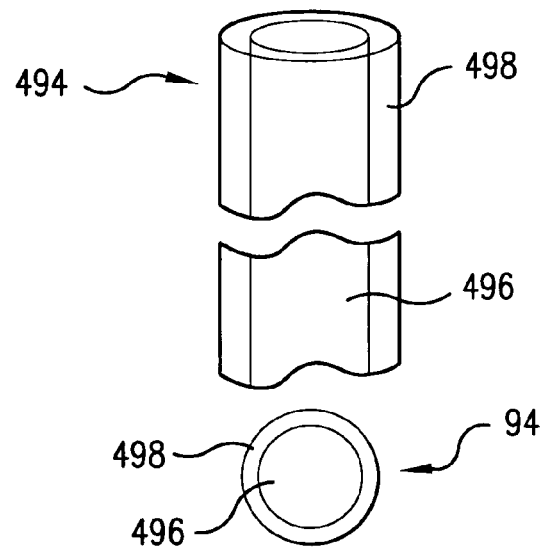
FIG. 9B shows schematically a tamper material formation mechanism according to aspects of an embodiment of the present invention.
Figure 9C:
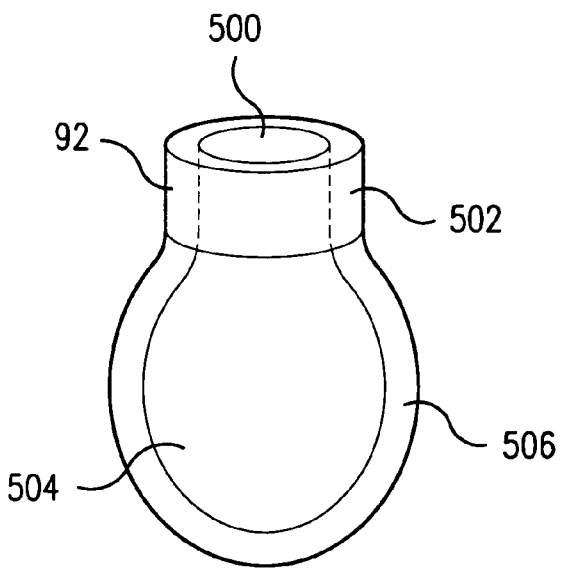
FIG. 9C shows schematically a tamper material formation mechanism according to aspects of an embodiment of the present invention.

Turning now to FIGS. 9A-C there are shown schematically possible ways to deliver a target, e.g., a droplet of metal 94, with a tamper material substantially surrounding the target droplet. In FIG. 9a, the target droplet 94 may be delivered in the form of a solid stream 490 emitting from a nozzle (not shown in FIG. 9A) in the target delivery mechanism 92. Surrounding the nozzle may be an annular ring opening (not shown) through which is delivered a column of gas 492, e.g., helium or hydrogen, that surrounds the stream 490 and ultimately surrounds the droplet target 94 when it forms from the liquid metal stream 490 within the stream of gas, which may be emitted from the target delivery unit annular opening with a sufficient velocity to keep the column of gas surrounding the target droplet 94 around the droplet until the point of irradiation and plasma formation at the plasma initiation site 28. It will be understood that the column may disperse somewhat on the way to the plasma initiation site 28 and other operating parameters, e.g., turbulence in the gas column 492 and/or other surrounding buffer gas, if any, e.g., due to previous plasma formations with previous target droplets, such that the column may not always and completely or evenly surround the target droplet 94 at the time of plasma formation. Substantially surround as used here and in the claims means substantially enough to provide significant enough absorption of kinetic energy from constituents of the plasma to play the role of an effective tamper itself and/or improves the tampering effect of the ambient gas in the region of the plasma formation to sufficiently improve conversion energy enough to justify the expense and complexity of the system, e.g., as shown in FIGS. 9A-C or the like, to delivery tamper material with the target droplet.

FIG. 9B illustrates schematically a system for delivering a stream for the formation of a target droplet 94, which when it forms from the stream 494 comprises a target droplet 496 substantially surrounded by tamper material 498. To this effect, the droplet forming stream 494 may be formed by concentric nozzles (not shown) in the target delivery unit 92, with the inner nozzle dispensing target droplet material, e.g., lithium or tin, and the nozzle delivering another liquid, e.g., water, that is transparent enough to DUV to act as an effective tamper. In this embodiment, the droplets 94 when formed from the stream 494 can be in the form of a target material 496 substantially surrounded by tamper material 498. It will be understood, as noted above that due to such factors as the dynamics of droplet formation from a multimaterial stream, and other operating parameters, substantially surrounding has essentially the same meaning as with the gas column embodiment of FIG. 9A, i.e., substantially enough to effective perform the tampering function and appreciably and efficiently improve the conversion efficiency.

FIG. 9C shows schematically another embodiment according to aspects of the present invention wherein the target droplet material 504, substantially surrounded by tamper material 506, is being formed into a combined droplet at the ejection nozzle of the target delivery system 92, comprising an inner nozzle 500 and an outer nozzle 502, either or both of which may be constantly or periodically be vibrated and/or squeezed and/or pressurized, otherwise operated upon to induce droplet formation at the exits of the nozzles 500, 502, the details of which are beyond the scope of the present invention, with the net result that the droplet once formed will have target material 504 substantially surrounded by tamper material, with substantially surrounded meaning as noted above.

Applicants have considered mechanisms for the creation of fast ions in a laser driven plasma, and have determined that is beneficial to be able to reduce the flux and energy of fast ions ejected from a laser driven plasma. When such a plasma is used as a source of EUV light, the fast ions can cause damage to the reflective surface of the collector mirror 30. Thus, by reducing the flux and energy of the ejected ions, damage to the mirror 30 and potentially other optical elements within or at the interfaces of the EUV light source chamber, can be reduced and the mirror and other optical element lifetimes can be increased with appropriately reduced cost of operation. High energy particles ejected from a plasma are created by ambi-polar diffusion resultant when electrons, with larger thermal velocity escape the plasma rapidly leaving a relative positive charge in the plasma interior. The charge imbalance creates an outward pointing electric field that accelerates the ions outward from the plasma and slows electron escape. In the case of the plasma in the EUV light source, the ambi-polar electric field may be cancelled by loading up the target, e.g., a droplet 94 of, e.g., lithium or tin, with a large negative charge to create an inward radial electric field. Putting charge on the target, e.g., a droplet, is relatively easy to do, e.g., by charging up the nozzle (not shown) to a very high negative potential or even by actively seeding the droplet 94. Thus, when the plasma is created, outward ion mobility can be impeded by the electric field so that only ions with greater potential are ejected. Charge can be placed on the target, e.g., the droplet 94 up to limits on the electrostatic breakdown to the nozzle relative to the magnitude of the ambi-polar field.

In operation it can be seen, by those skilled in the art, that according to various aspects of embodiments of the present invention an excimer laser amplifier chamber, e.g., a KrF, XeF or XeCl gas discharge amplifier portion of a LPP EUV drive laser system may be wavelength coupled to a seed laser comprising at least two seed laser beams or different wavelengths passing through a coupling optic that is essentially transparent to light at the two wavelengths but also essentially fully reflective, at least on the cavity facing side to a third wavelength that is generated by a non-linear optical element that converts the seed laser light at the two wavelengths to the third wavelength. This third wavelength is at the required gain point for the, e.g., KrF, XeCl or Xef amplifier laser which then acts as an oscillator cavity to produce an output laser light pulse beam at the third wavelength to act as the drive laser. Such a system significantly reduces, e.g., possible coupling losses that occur in coupling a seed laser light pulse beam into another oscillating resonance cavity at the appropriate wavelength for lasing in the amplifier cavity by converting the seed laser inputs to the appropriate amplifier wavelength within the amplifier cavity in this form of a MOPO drive laser configuration. The opposite can also be done, e.g., with IR light, using an excimer laser with conversion to get the seed frequency/wavelength. This can also be done with YLF seed lasers to tune the YLF seed frequency. The disclosed wavelength coupling be in more effective than, e.g., polarization coupling or spatial coupling or wavefront division coupling or using a partial reflector coupling in a PO configuration.

Also in operation according to aspects of an embodiment of the present invention, a much more advantageous manner of pulse shortening in provided over the prior art use of, e.g., spatial slicing. The utilization of polarization slicing allows for much more efficient slicing with much less loss of energy in the sliced pulses than, e.g., spatial slicing. It will be understood that this may be used also for other MOPA or MOPO arrangements, e.g., for XeF or XeCl to get into the needed range of less than about 5-6 ns. This technique could also be used, e.g., to run two MO in parallel and combine their output laser light pulse beams into one seed beam. This could also be used to change, e.g., a 50 ns YLF into two 25 ns pulse before, e.g., a the XeF PA stage. The technique also allows for obtaining a higher peak intensity per separated pulse before recombination.

It will also be understood that the above described stimulated brillouin scattering, e.g., for generating shorter pulses can also be done, e.g., for XeF, e.g., at 351 nm. those skilled in the art will understand that according to aspects of an embodiment of the present invention, extra passes can produce even shorter pulses and that the disclosed techniques are applicable as well, e.g., to YLF, e.g., with a YLF seeded XeF system. This technique is also applicable in the tuning of seed lasers as discussed above for LPP EUV drive laser systems. Stimulate Raman scattering can also be used for obtaining a shift for tuning purposes.

Also according to aspects of an embodiment of the present invention those skilled in the art will understand that manipulation of seed laser wavelength and pulse length, e.g., shifting of YAG or YLF or other solid state laser wavelengths to match the PA or PO excimer amplifier gain requirements and also pulse shortening can be utilized to provide suitable high power high pulse repetition rate solid state MO seed lasers for use with varying excimer or molecular fluorine gas discharge power amplifier laser systems as part of a LPP EUV light source drive laser configuration. For example, shifting the output, e.g., of a YLF laser by manipulating the operating temperature can influence on the efficiency of the YLF pumping of the PA, with the ability to obtain very high MO pulse rates, e.g., up to around 12 kHz. The embodiment of 2, it will be understood utilizes a birefrigent filer and an electro-optic coupler.

Utilizing an Nd:YLF with shorten pulse length and a modified fundamental frequency, according to aspects of an embodiment of the present invention can be very beneficial in LPP EUV light source plasma production with a drive laser(s). The efficiencies of the PA with multiple, i.e., n passes with n>2 can be significant. Also possible is the utilization of only a single pass or two passes with a longer electrode that applicants assignee currently uses, e.g., in MOPA configured lasers, e.g., the XLA series multi-chambered lasers.

Figure 10:
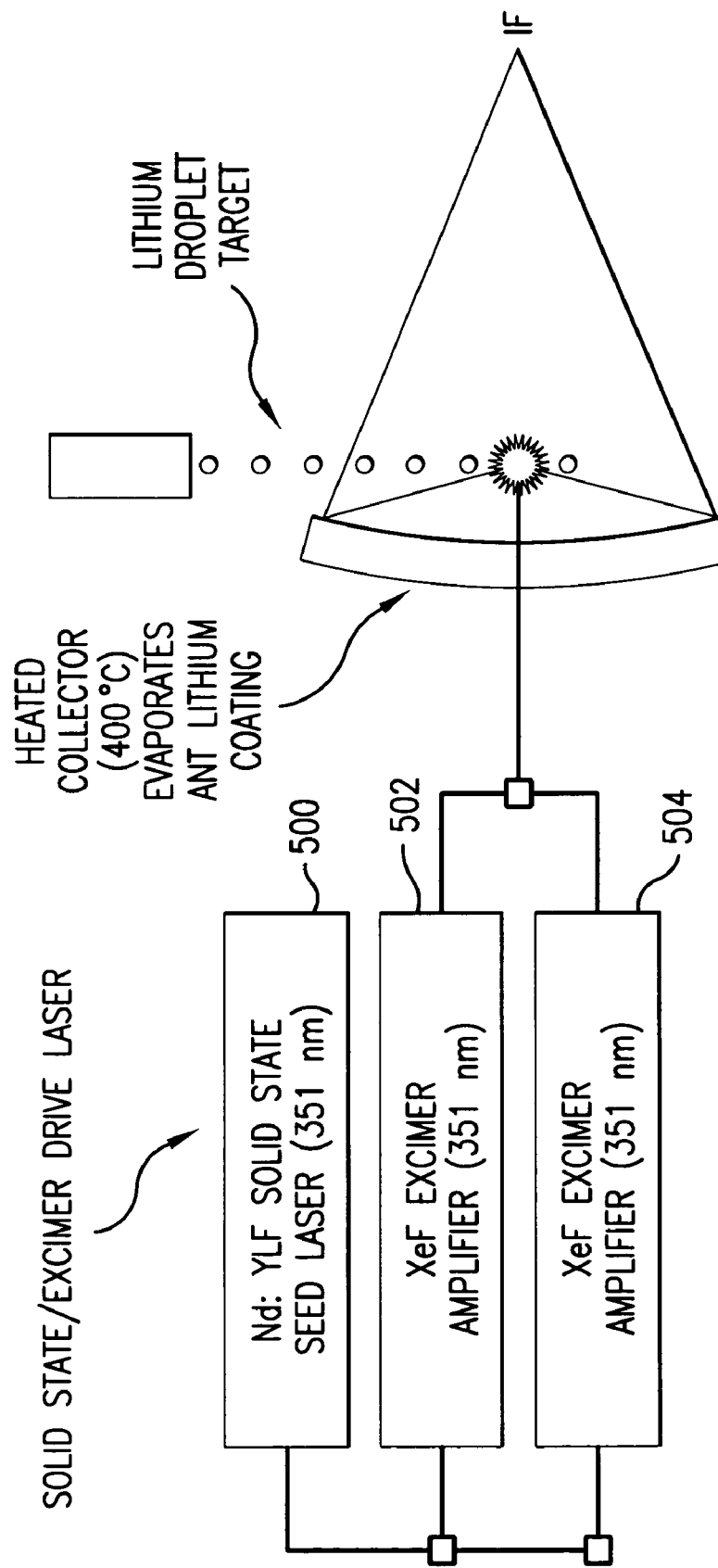
FIG. 10 shows schematically a drive laser system according to aspects of an embodiment of the present invention.

Applicants have demosntyrated a 600 W drive laser system as shown schematically in FIG. 10, comprising an Nd:YLF solid state seed laser 500 running at 6000 Hz and seeding a pair of XeF excimer laser amplifiers 502, 504 in parallel, e.g., at a rate of 3000 Hz for each amplifier, with a total drive laser pulse repetition rate of 6000 Hz and a beam quality of <150 μRad, a pulse energy stability of 1% in a burst of 30 pulses and a efficiency of 3.5% with a pulse length of <15 ns and a pointing stability of <50 μRad. The output pulse energy in the prototype is about 100 mJ. The prototype system has so far accumulated about 4B pulses of drive laser beam pulses. Such a system scales up to a 7040 W system, by increasing the number of drive laser frames from 1 to 2, with a pair of amplifier lasers 502, 504 in each frame, and scaling the pulse repetition rate to 4000 Hz, 6000 H and then 8000 Hz for a total drive laser output per frame of 8, 12 and 16 kHz respectively per each scalled up system and a total drive laser system pulse repetition rate of, respectively 16, 24 and 32 kHz, and also scaling up the output pulse energy to 220 mJ, through 190 mJ, and 210 mJ, resulting in a final system producing the 7140 W and intermediate systems of 2280 W and 5040 W, with 12 and 24 drivel laser amplifiers in the respective systems.

It will be understooood that the amplifier lasers may be in a tick-tock timing configuration or fired at the same time, e.g., in each frame or in all frames and thereafter optically combined to creat higher energy pulses put at a lower total pulse repetition rate.

The wavelength of the 3rd harmonic Nd:YLF MO can be shifted to match the XeF gain spectrum. A solid state MO provides the required high seed beam quality and the XeF power amplifiers provide reliable pulse energy.

Presently contemplated for the EUV source system is the utilization of a continuous stimulated droplet generation droplet target delivery system providing droplets of liquid metal (e.g., Li or Sn), with the droplets diameter <100 μm in diameter, at rates well in excess of the finally needed 32 kHz, e.g., if every other drop is to be used for plasma formation at the rate of 64 kHz. It may also be required to do drop-on-demand droplet delivery, e.g., for 30-60 μm droplets. Major issued remaining to be addressed for the contemplated EUV production system include source material (e.g., li or Sn) buildup on the collector and other optical surfaces, sputtering of the layers of the MLM forming the collector reflective surfaces, source material and other ion implantation/diffusion into MLM, deposition of material sputtered from source hardware, deposition of source material contaminants, EUV induced carbon growth and oxidation, and thermal stability of MLM.

Figure 13A:
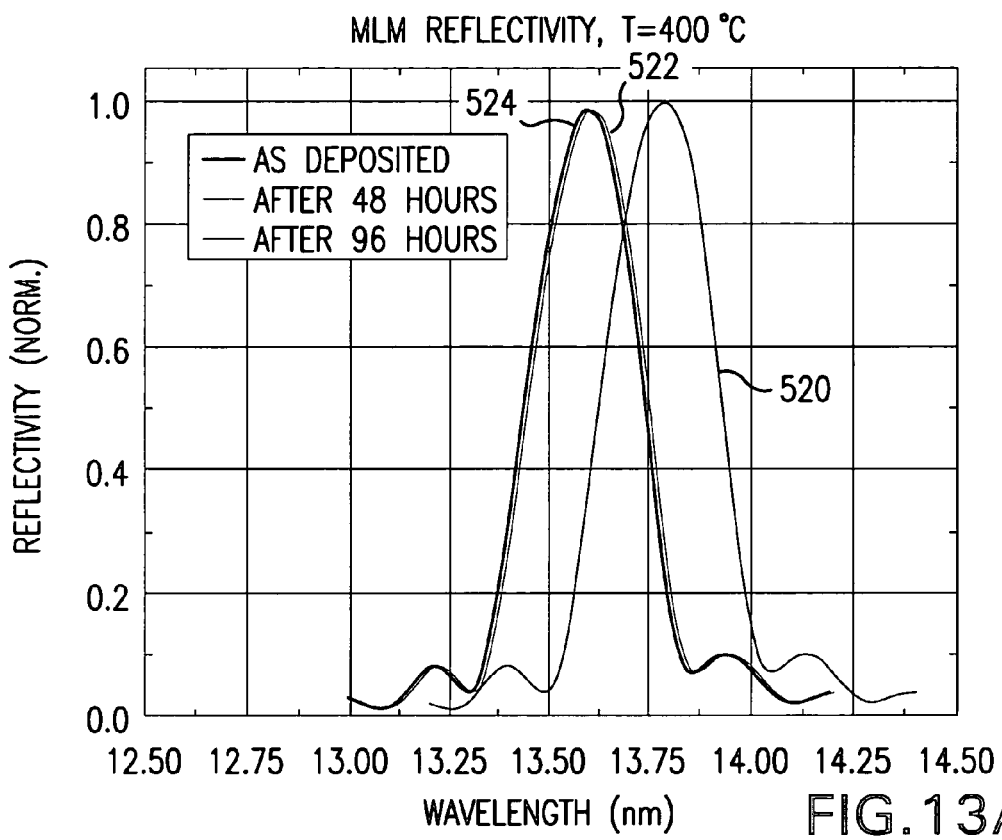
FIGS. 13A and 13B shoe reflectivity of MLMs at elevated temperature.
Figure 13B:
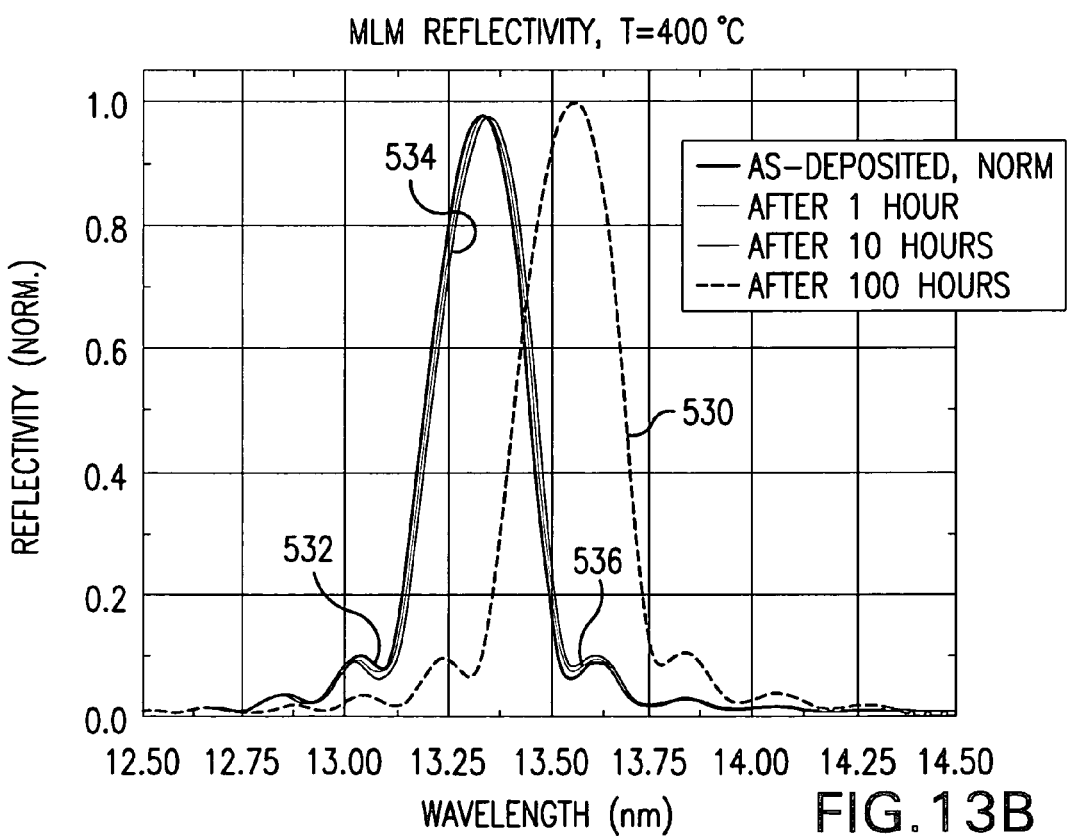

High temperature MLM materials exist which show relatively high reflectivity. As shown in FIG. 13A an MLM material's reflectivity is plotted against wavelength immediately after coating, with no exposure in curve 520 with curve 522 representing after 48 hours at T+400° C. and curve 524 being after 96 hours at that temperature. Curve 530 in FIG. 13B represents another MLM material before heat exposure and curves 532, 534 and 536 represent exposure to T=400° C. for 1 hour, 10 hours and 100 hours respectively.

Figure 11:
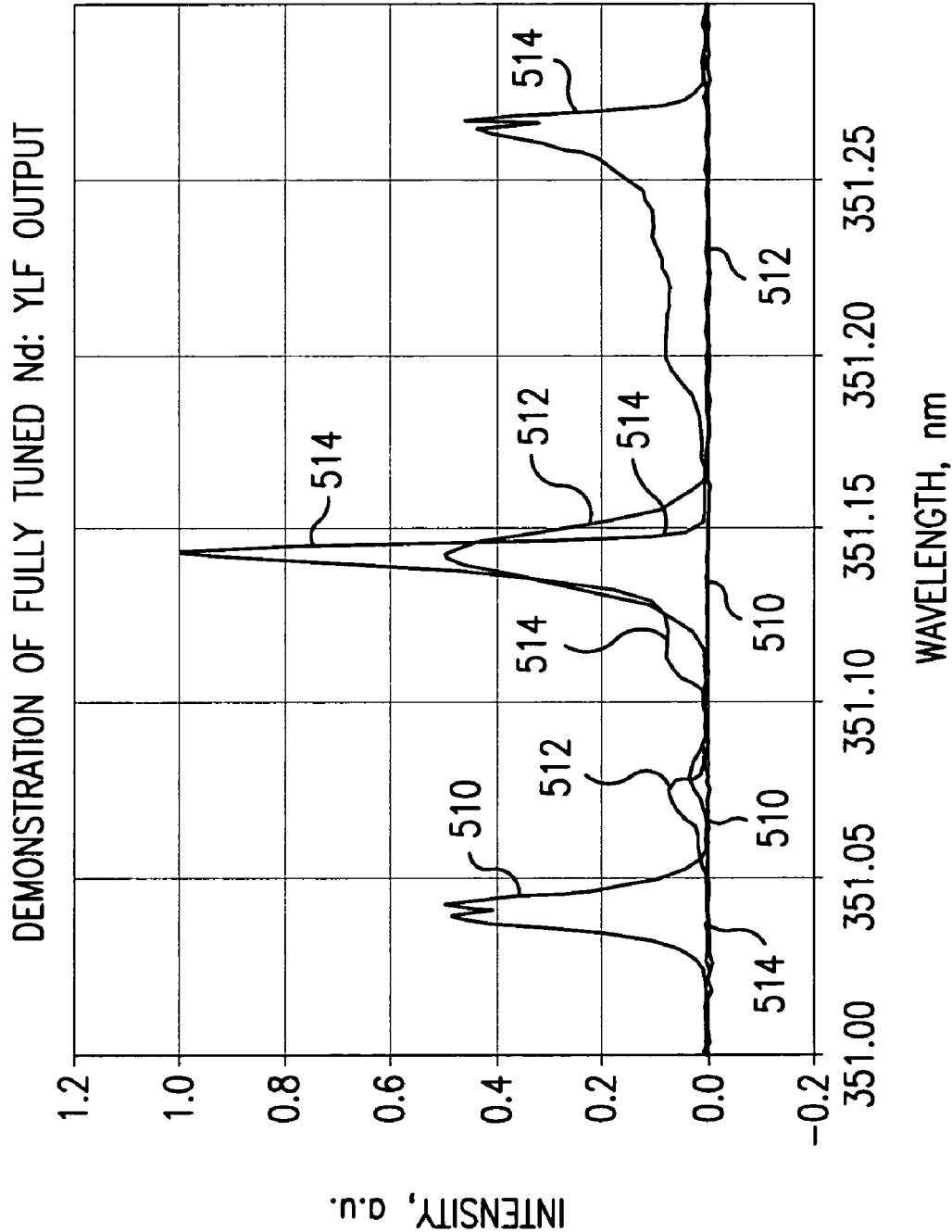
FIG. 11 shows a plot of a shifted seed solid state laser spectrum.
Figure 12:
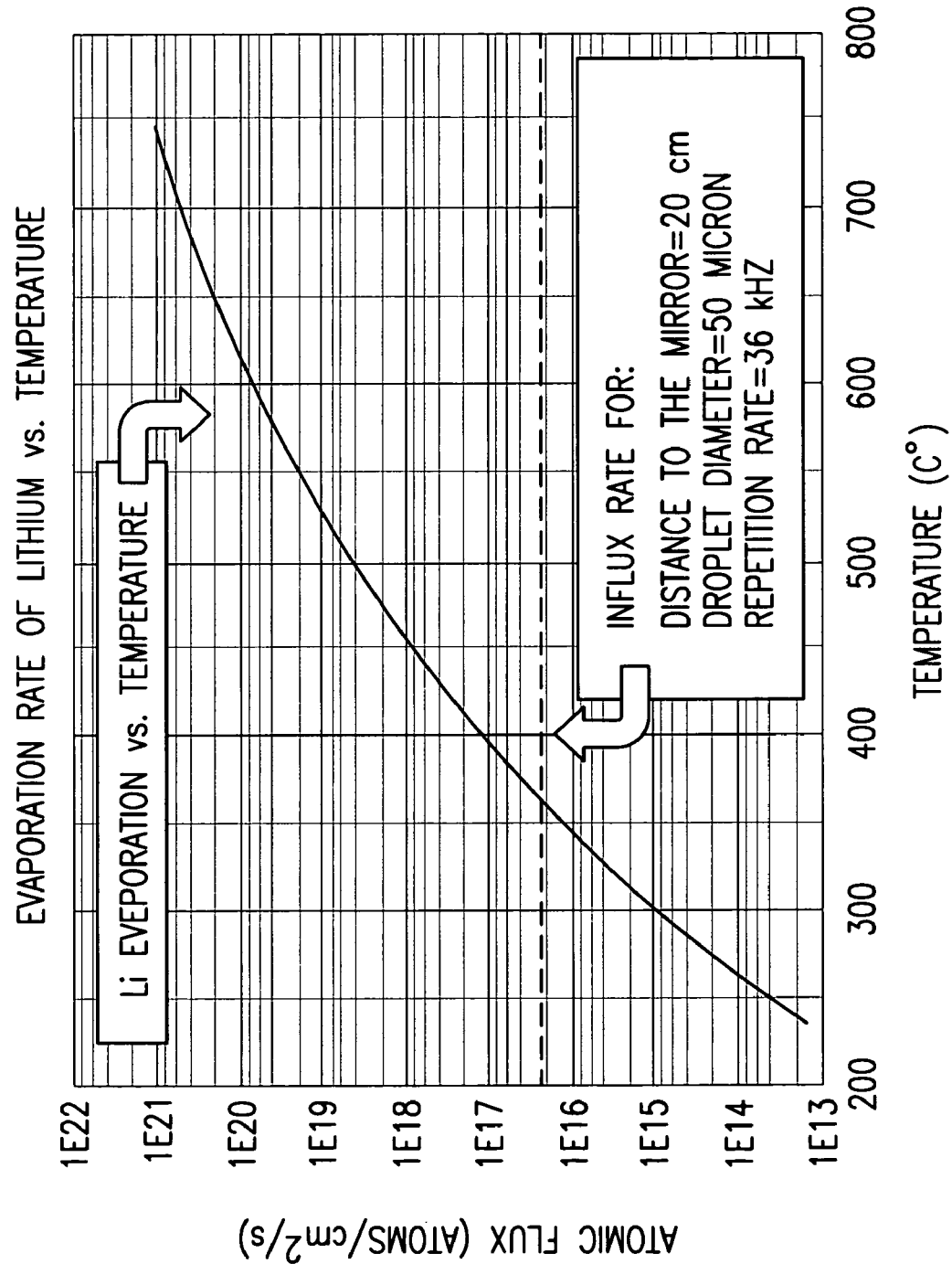
FIG. 12 shows evaporation of Li vs. temperature.

As shown in the chart of FIG. 11, the wavelength of a, e.g., third harmonic Nd:YLF solid state laser 500 may be shifted to match the gain in the XeF amplifier lasers, with the curve 510 representing the unshifted Nd:YLF spectrum, the curve 514 representing the XeF spectrum and the curve 512 representing the shifted Nd:YLF spectrum to be ampliried in the amplifier gas discharge excimer lasers 502, 504.

Figure 14:
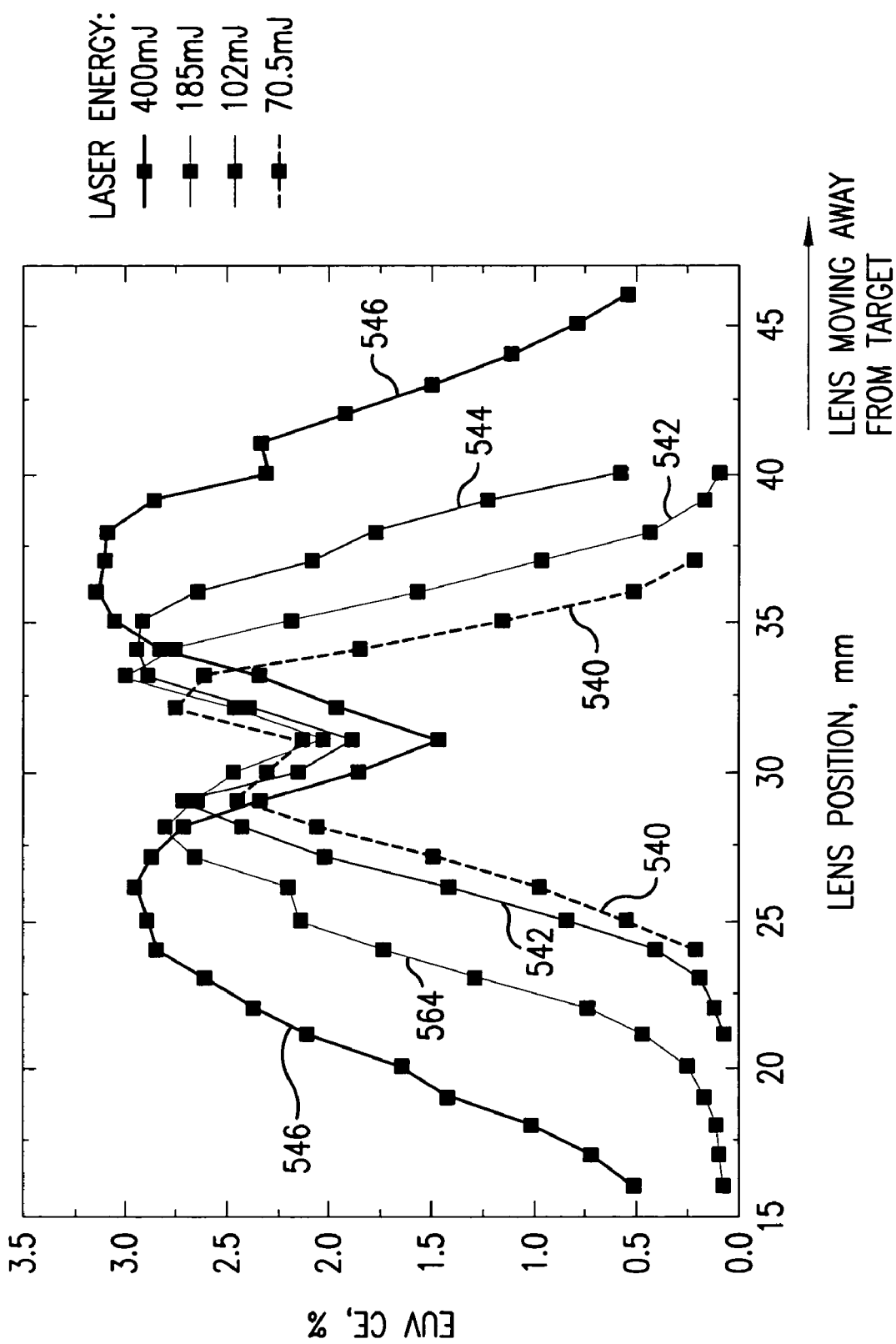
FIG. 14 shows EUV CE vs. drive laser focus.

Applicants have made LPP EUV in band conversion efficiency ("CE") measurements, e.g., in relation to the positioning of the target, e.g., a flat foil of plasma source material, but also applicable with appropriate scaling applicants believe to discrete targets, e.g., target droplets, and the focal point of the drive laser, e.g., as shown in FIG. 14 which is a chart of measured EUV CE vs Lens Position for a flat target sheet. For these measurements CE scans were performed at fixed laser energy by moving focusing lens through the focus, with a laser pulse ~10 ns, a non uniform intensity distribution. The model was set up for a flat top laser pulse with the 1-D model implying perfectly uniform laser beam profile. Lithium provides a broad laser wavelength choice. CE generally remains constant vs. wavelength ~2.5-3% into <<2% bandwidth and the CE at XeF Excimer wavelength is high.

FIG. 14 shows plots of EUV CE % for a Li flat foil/sheet target for laser pulse energies of 70.5 mJ 550, 102 mJ 542, 185 mJ 544 and 400 mJ 546 as a function of lens position, i.e., focal point with the two humps occurring one either side of the focal point of the lsne focusnig the drive laser beam at the target.

Figure 15A:
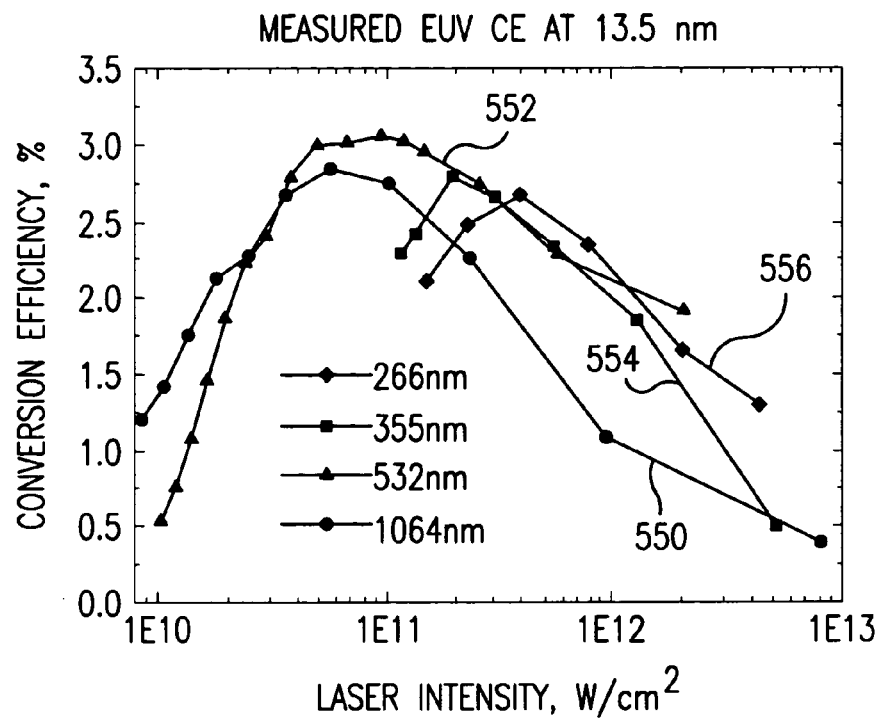
FIGS. 15a and B show, respectively measured and calculated EUV CE for various irradiation wavelengths.
Figure 15B:
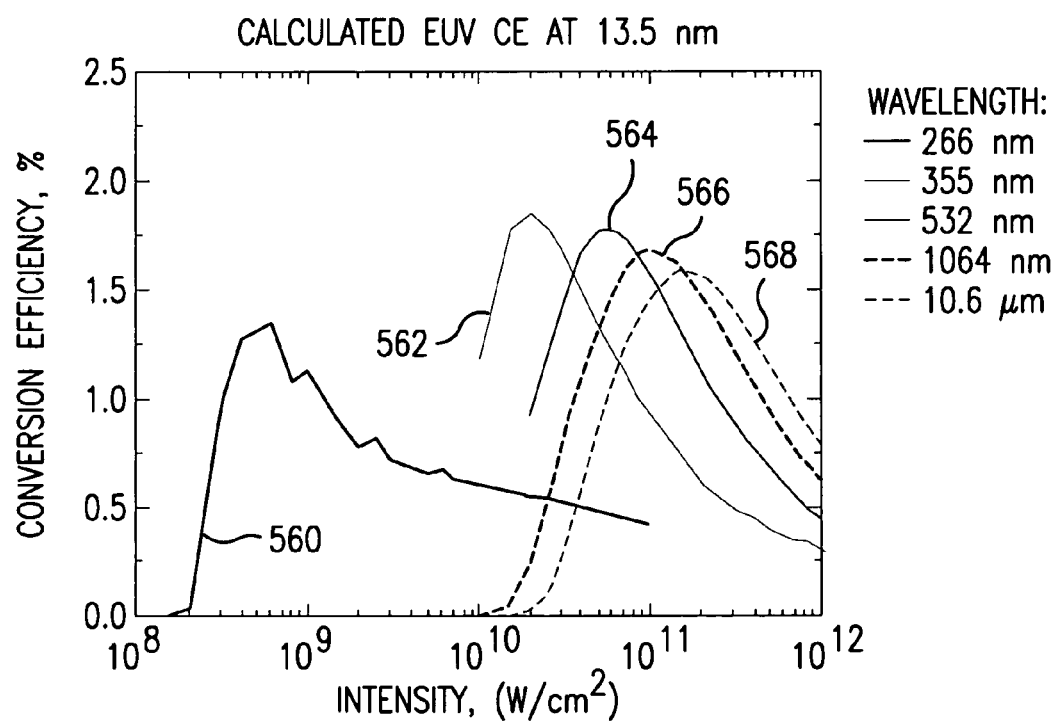

FIGS. 15A and 15B respectively show a measured set of CE curves and a calculated set of CE curves each at 13.5 nm based upon, in the case of FIG. 15S irradiation with a drive laser at 1064 nm wavelength 550, 532 nm wavelength 552, 355 nm wavelength 554 and 266 nm wavelength 552. In FIG. 15B the curves represent 10.6 μm 560, 1064 nm 562, 523 nm 564, 355 nm 566 and 266 nm 568.

Applicants have also examined the ratio of EUV at different angles for lithium as shown in FIG. 16, for 20°, 50° and 75° angles along with relative lens position, respectively curves 570, 572 and 574. The target material used was Li and the laser wavelength for irradiation was 355 nm for which the ratios for 50°:25° was 0.75 and for 75°:25° was 0.68. For 1064 nm drive laser irradiation these rations were, respectively 0.58 and 0.42. These measurements were made with a planar target and applicants expect better uniformity for droplets thrugh the various clection angles from the plasma initiation site.

Figure 17B:
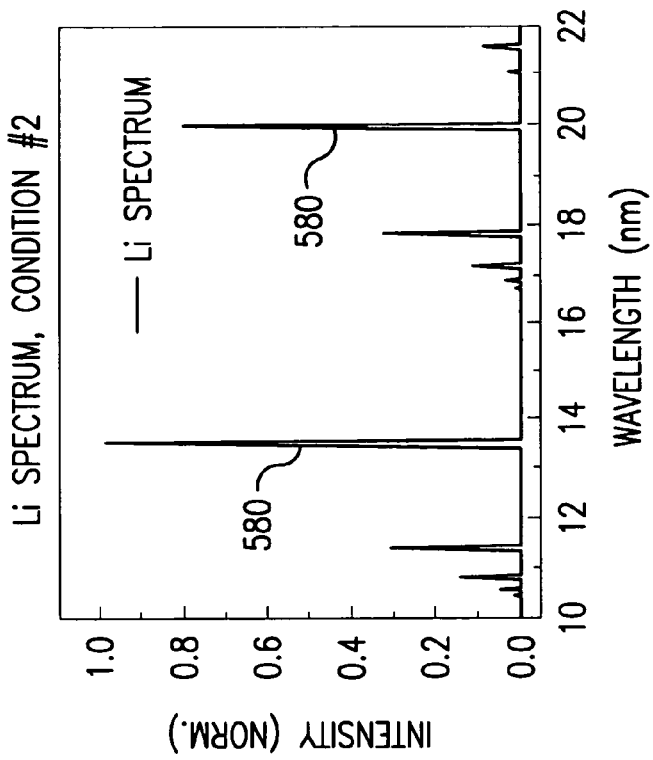
FIGS. 17A and B shown Li spectra and an MLM reflectivity spectrum.
Figure 17A:
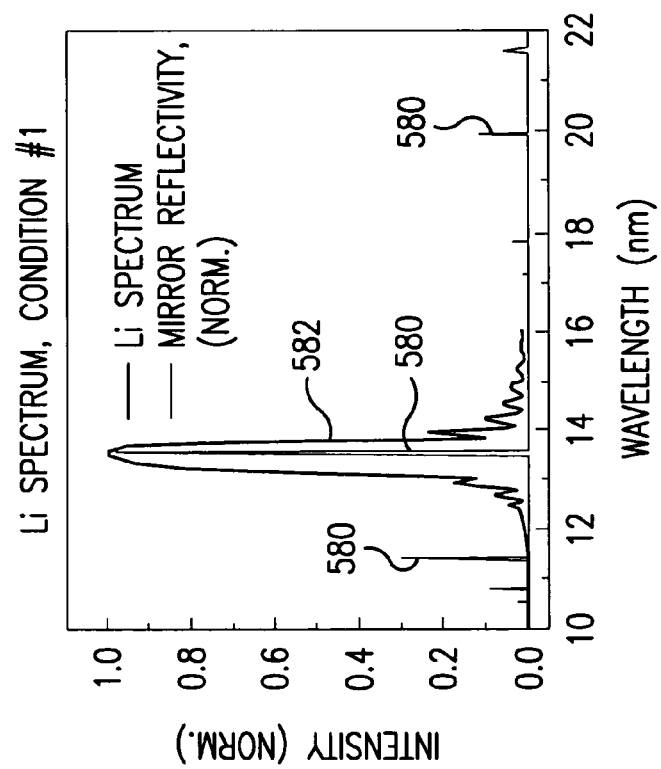
Figure 18A:
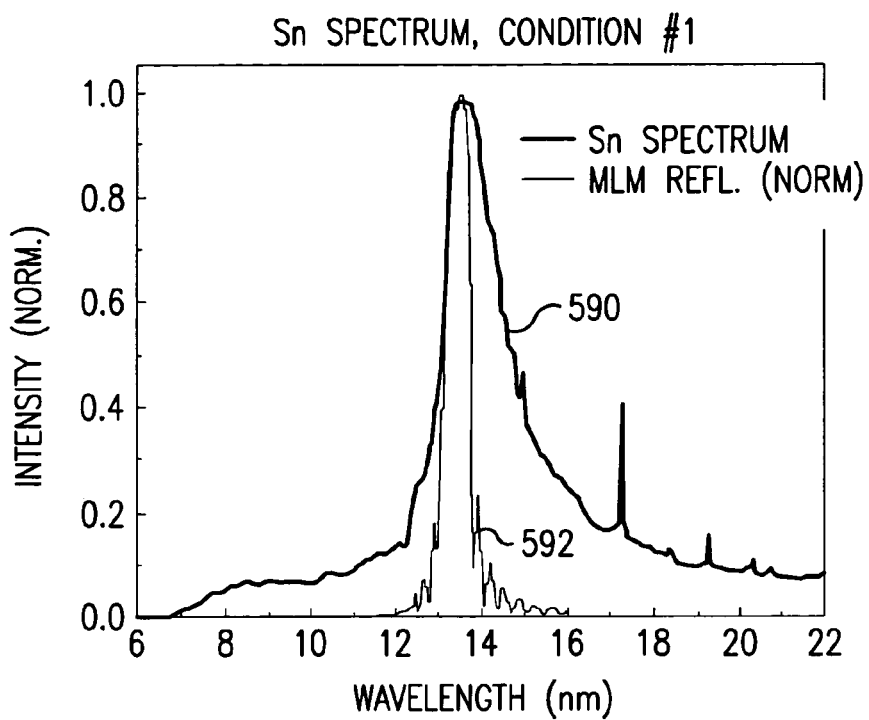
FIGS. 18A-D show various sn spectra and an MLM reflectivity spectrum.
Figure 18B:
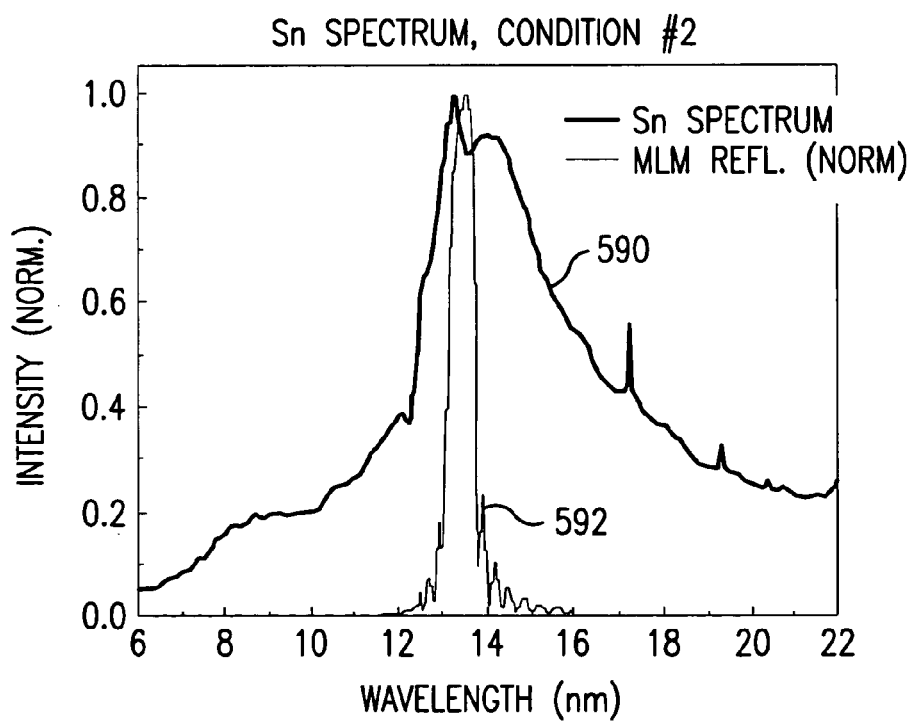
Figure 18C:
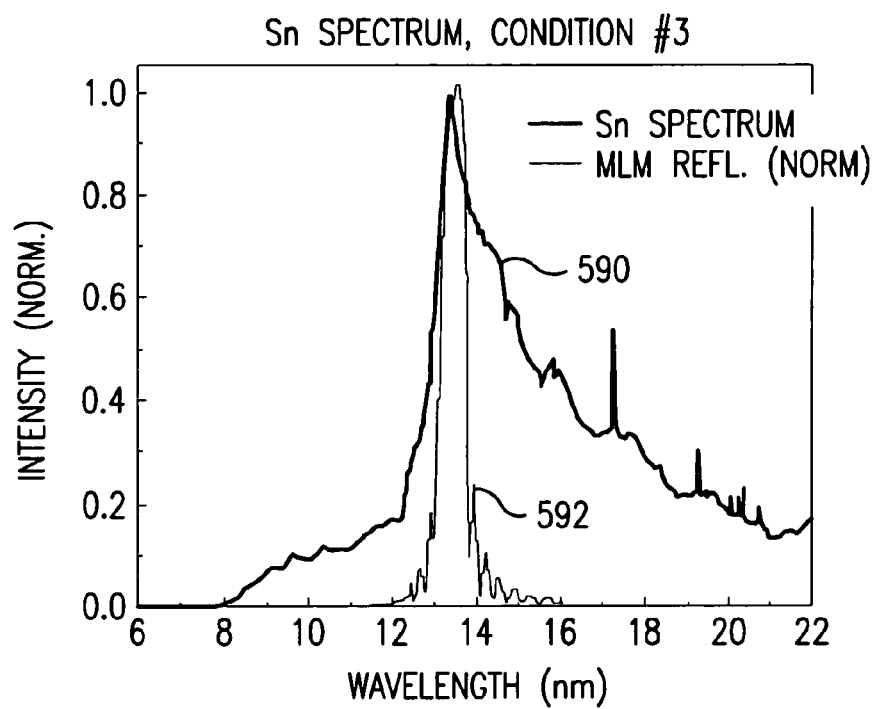
Figure 18D:
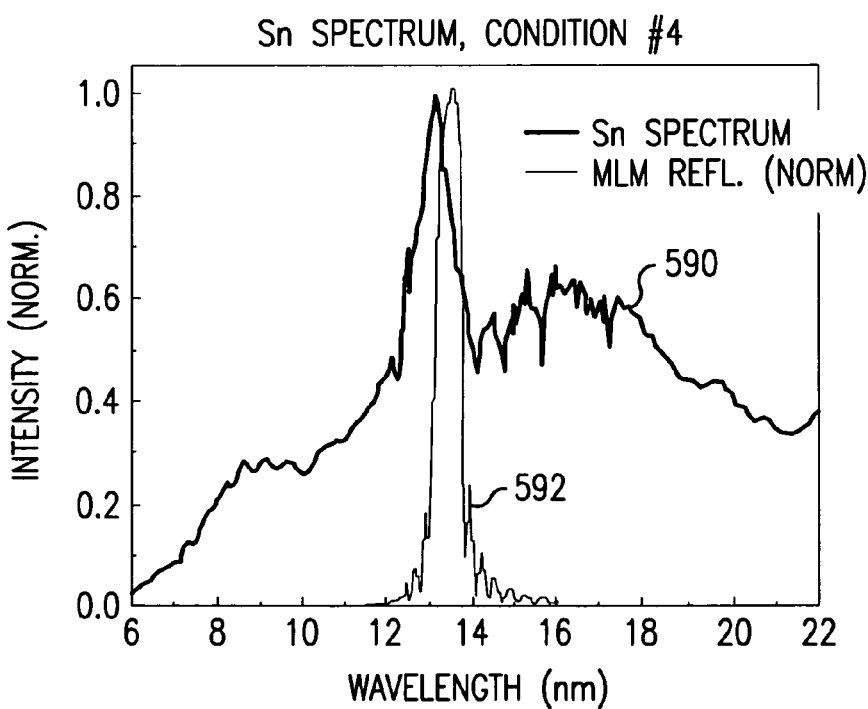

As is shown in FIGS. 17A and 17B, applicants have observed radiation from different ion species. Also for different laser parameters, different plasma temperatures are achieved. Members of the same series of spectral lines show similar behavior. The plots 580 represent Li spectra and the curve 582 is the normalized reflectivity spectrum for an MLM collector surface.

As shown in FIGS. 18a-D Sn spectra show variation of spectra vs. laser parameters. Sn has broad spectral emission of many overlapped lines. The curve 590 is the Spectrum for Sn and the curve 592 is a normalized reflectivity spectrum for the MLM surface.

Figure 19A:
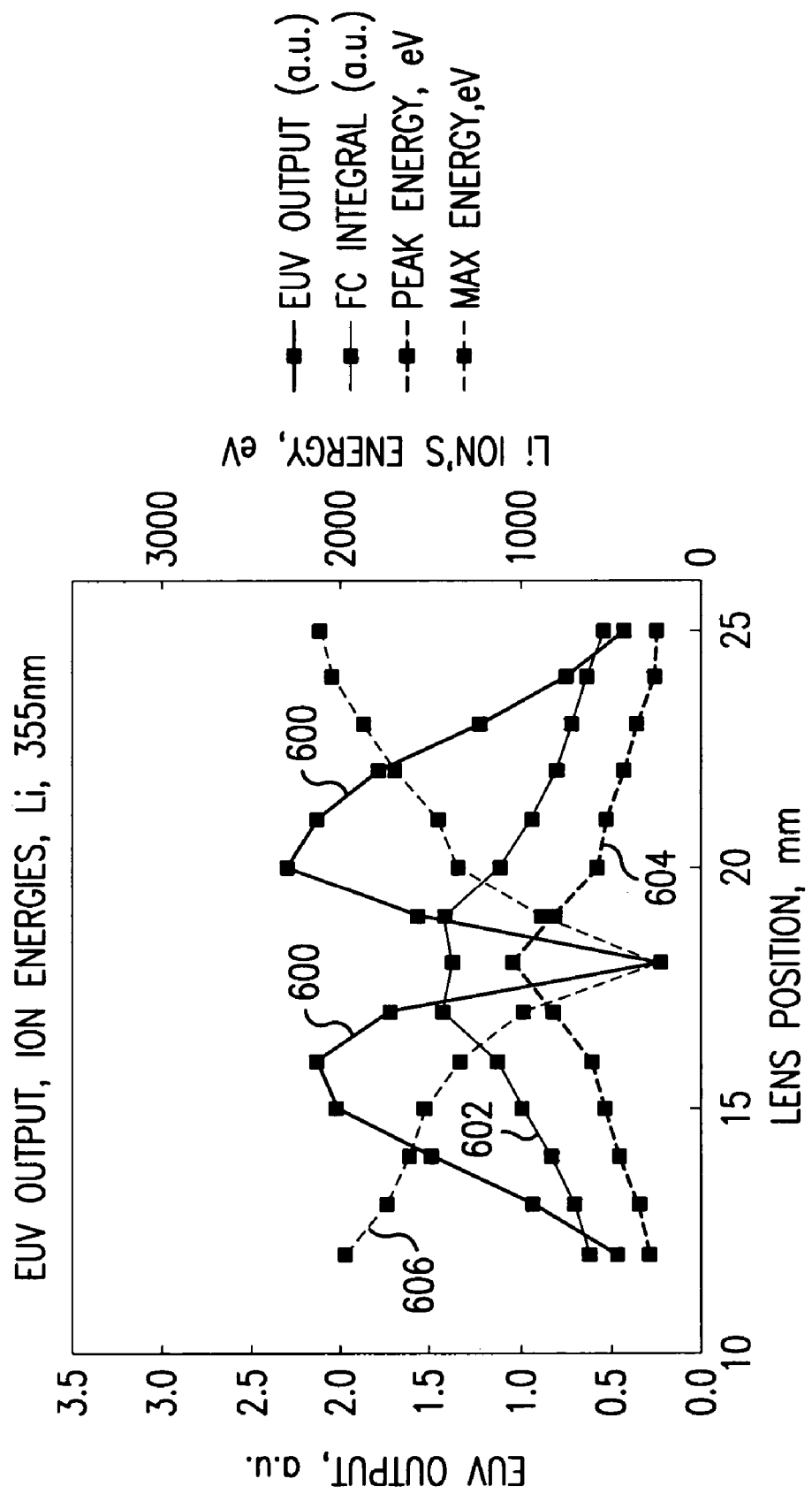
FIGS. 19 a and B show EUV outputs and ion energies.
Figure 19B:
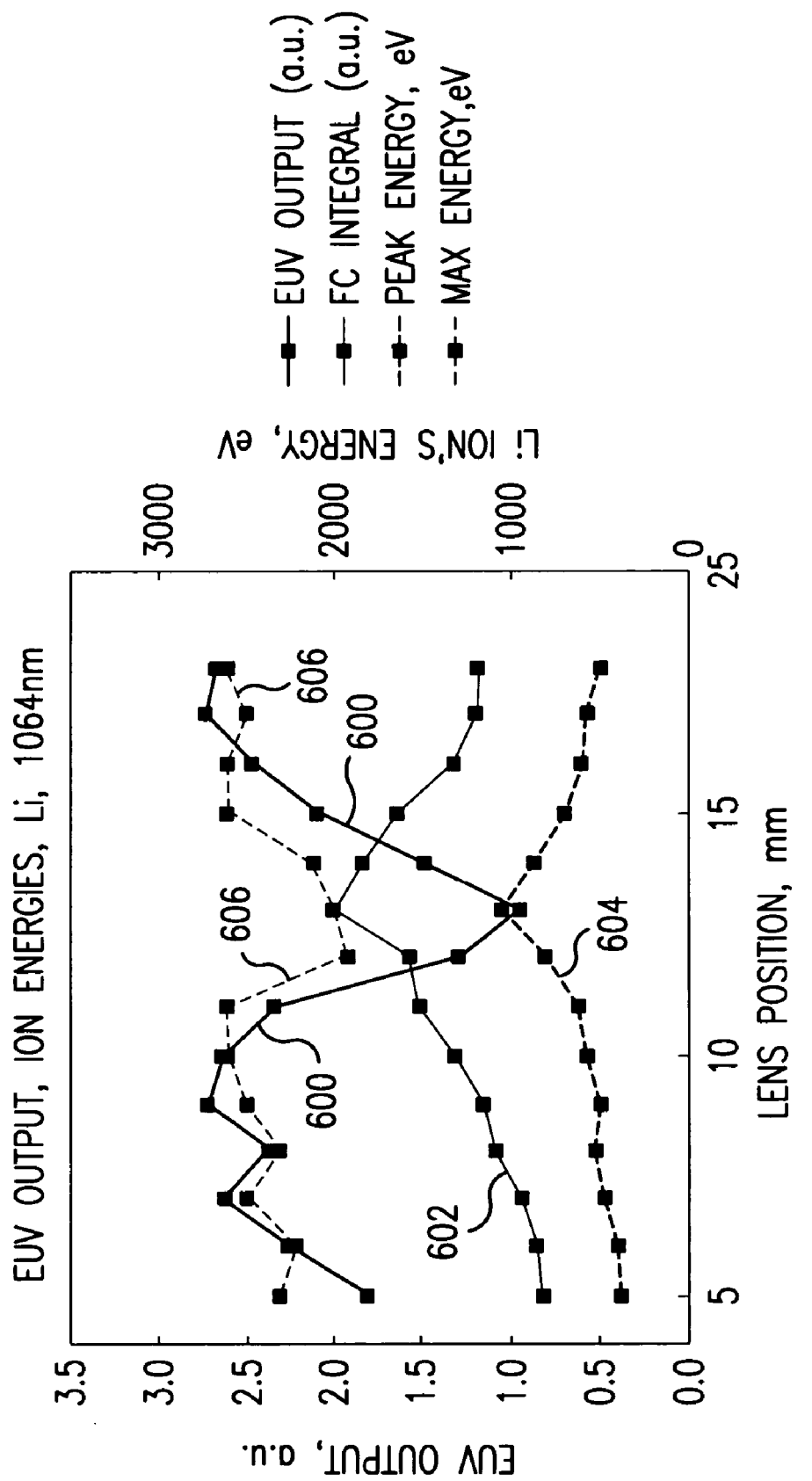
Figure 20:
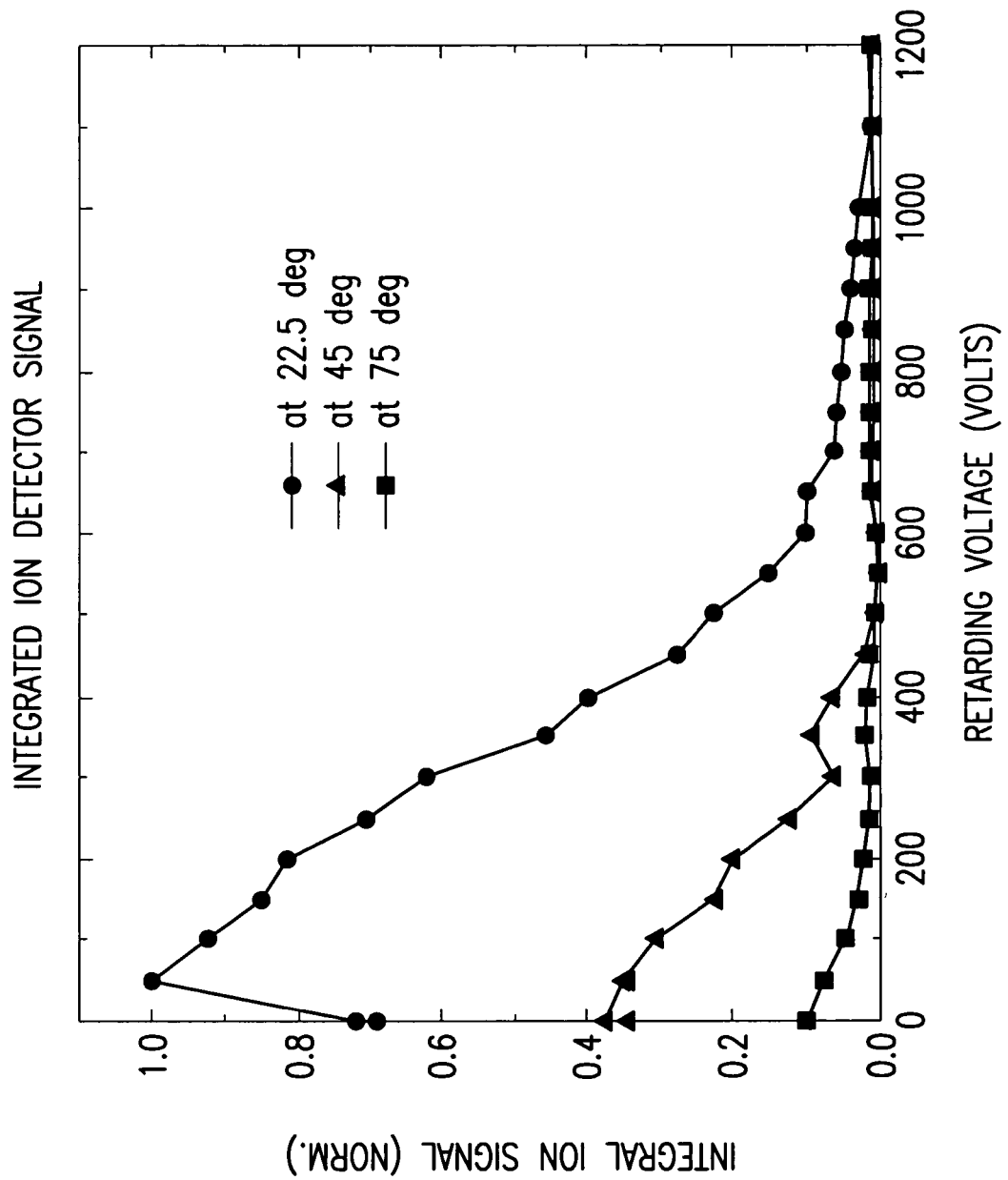
FIG. 20 shows integrated ion detection signals.

FIGS. 19A and 19B show EUV output 600 and ion energies, peak 602 and max 604 respectively for Lithium irradiated at respectively 355 nm and 1064 nm and the FC integral 606. These were measured using a collector having in the path between the ion/photon source and the collector a grounded outer grid, a retarding grid at 0-200V and a supressor grid at about −50V in order approaching the collector. All Li ions can be stopped with an electric field. applicants expect the ion flux to be larger at normal to the planar target.

Applicants have measured EUV at 13.5 nm at an α of ≦5° from a flat Lithium target irradiated at respectively 355 nm and 1064 nm as observed in a CCD camera through a 50 μm pinhole in a 200 nm Zr foil sheet and reflected off of a 45° mirror to the camera plasmas with, respectively FWHM sizeX=140μ and FWHM sizeY=110μ and an Etendue<0.012 mm2 sterad and FWHM sizeX=230μ and FWHM sizeY=120μ and an Etendue<0.032 mm2 sterad.

High energy ions developed by LPP including for Xe (131 amu) irradiated with 1064 nm laser light generating 20,000 eV maximum and 10,000 eV peak ion energies as reported by Red reported by Innolite at EUV Source workshop February 2003Symposium and the following values observed by applicants for Sn (amu 119), 1064 nm, 6,500 max and 2,450 peak, Sn 335 nm, 5,600 max and 1550 peak and Li (amu 7) 1064, 1,200 max and 550 peak and Li 355, 1,100 max and 500 peak, with the respective relative sputter rate of the MLM for each group being 140%, 84%, 9.3% and 7.8%, as calculated with TRIM. From this it can be observed that Sn and Xe ions have significantly higher energies and Li sputter of collector is an order of magnitude less than Sn and Xe.

Figure 21B:
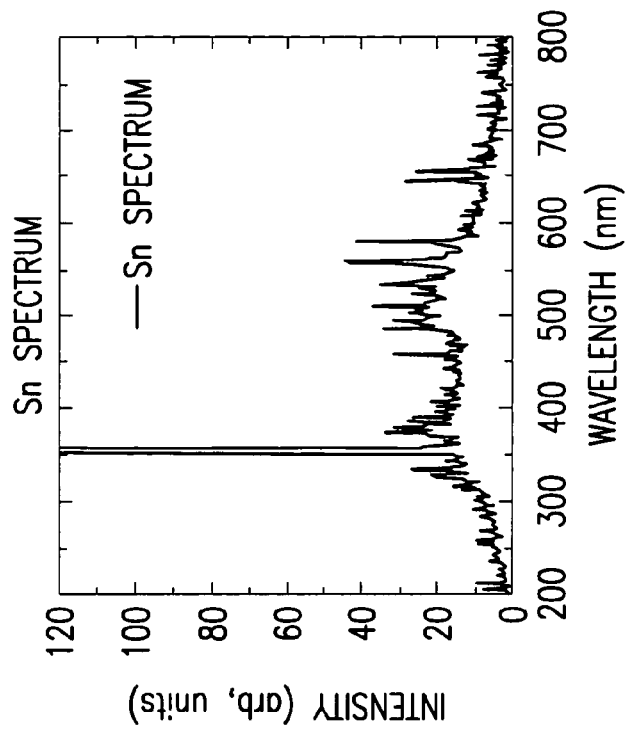
FIGS. 21A and 21B show Li and Sn spectra.
Figure 21A:
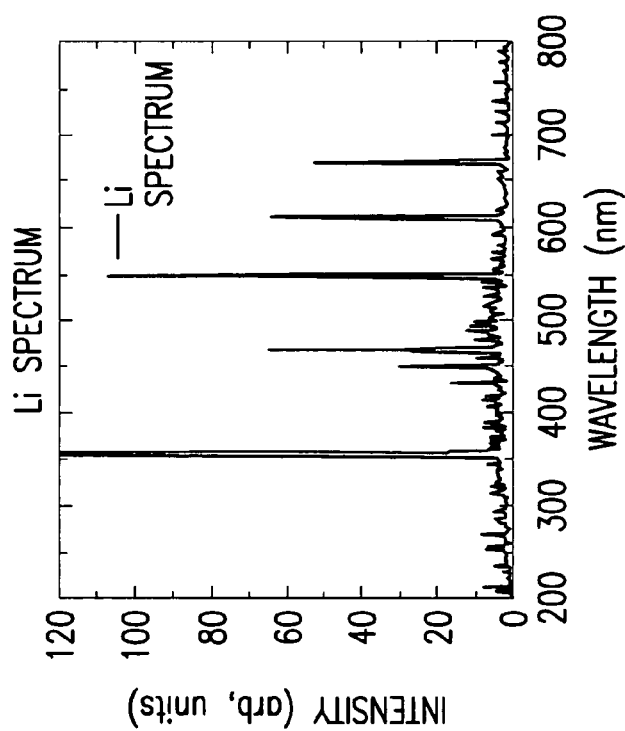

FIGS. 21 A and 21B show the UV/visible spectra for Li and Sn respectively when irradiated at 355 nm. There is a single pulse spectra shown, with the scatter of 355 nm light is off scale and no correction for absolute spectral sensitivity was made. The integral for Sn is higher then for Li.

Table I shows a roadmap for LPP EUV source development, with the various configurations, including embodiments discussed above that are contemplated will be employed.

TABLE I

LPP Source Roadmap

|  | 2004 | 2005 | 2006 | 2007 |
|---|---|---|---|---|
| Number of laser frames | 1 | 1 | 2 | 2 |
| Power amplifiers per frame | 2 | 2 | 2 | 2 |
| Rep rate per amplifier (kHz) | 4 | 6 | 6 | 8 |
| Drive laser rep rate (kHz) | 8 | 12 | 12 | 16 |

TABLE I-continued

LPP Source Roadmap

|  | 2004 | 2005 | 2006 | 2007 |
|---|---|---|---|---|
| Total rep rate (kHz) | 8 | 12 | 24 | 32 |
| Pulse energy (mJ) | 100 | 190 | 210 | 220 |
| Drive laser power (W) | 800 | 2280 | 5040 | 7040 |
| Transmission BTS | 96% | 96% | 96% | 96% |
| In-band CE | 2.5% | 2.5% | 3.2% | 4.0% |
| Geometric collection efficiency (sr) | 5 | 5 | 5 | 5.5 |
| Collector obscurations | 6% | 6% | 4% | 4% |
| Collector average reflectivity | 35% | 41% | 48% | 50% |
| Collector Lifetime (k hrs) | 0.0 | 1 | 5 | 10 |
| Buffer gas transmission | 90% | 90% | 90% | 90% |
| Total power at IF (W) | 4.52 | 15.10 | 51.10 | 102.23 |

As contemplated the path to EUV production with 100+ W at the intermediate focus involves according to aspects of an embodiment of the present invention lithium droplets targets irradiated with an excimer laser seeded at the appropriate wavelength. Only LPP can meet anticipated HVM requirements. Li maximizes in-band CE and minimizes out of band radiation with manageable debris mitigation. Excimer laser technology presents according to aspects of an embodiment of the present invention the best drive-laser solution. Excimer technology scales to high power through higher rep rates. Excimer lasers have a track record indicating capability to provide high reliability at affordable cost of operation. The main challenge is lifetime of Primary collector.

Those skilled in the art will understand that many changes and modifications may be made to the present invention without departing from the intent and scope of the coverage of the appended claims. The aspects of embodiments of the present invention discussed above are intended to be illustrative of preferred embodiments and the appended claims should not be limited in scope to any such preferred embodiment(s).

We claim:

1. A high conversion efficiency laser produced plasma extreme ultraviolet ("EUV") light source utilizing a pulsed laser beam to irradiate a plasma initiation target, comprising;
   a laser output light pulse beam source, producing laser output light pulses at a selected pulse repetition rate and having a pulse duration due to the characteristics of the operation of the output light pulse beam source that is not short enough form obtaining a desired EUV conversion efficiency;
   a power amplifier laser system;
   a pulse duration shortener comprising:
   a selection mechanism selecting a first selected portion of an output light pulse produced in the output light pulse beam source and directing the first selected portion through the power amplifier while an amplifying medium is present in the power amplifier, and for selecting a second portion of the output light pulse produced in the output light pulse beam source and directing the second selected portion through the power amplifier while the amplifying medium is present in the power amplifier;
   a combining mechanism substantially overlapping the first and second portions to form a combined beam to irradiate the target having a pulse duration short enough for producing the desired conversion efficiency.

2. The apparatus of claim 1 further comprising:
the combined beam having substantially one half of the pulse duration as the laser output beam pulse produced by the laser output light pulse beam source and containing substantially all of the energy contained in the laser output light pulse produced by the laser output light pulse source.

3. The apparatus of claim 1 further comprising:
the laser output light pulse source comprises a molecular or excimer gas discharge laser oscillator with an output pulse duration determined at least in part by the transition states of at least one the constituent of the lasing medium.

4. The apparatus of claim 2 further comprising:
the laser output light pulse source comprises a molecular or excimer gas discharge laser oscillator with an output pulse duration determined at least in part by the transition states of at least one the constituent of the lasing medium.

5. The apparatus of claim 1 further comprising:
the selection mechanism comprises a pulse chopper separating the laser output light pulse into a first portion comprising substantially one half of the energy in the laser output light pulse and a second portion comprising substantially the other half of the energy in the laser output light pulse.

6. The apparatus of claim 2 further comprising:
the selection mechanism comprises a pulse chopper separating the laser output light pulse into a first portion comprising substantially one half of the energy in the laser output light pulse and a second portion comprising substantially the other half of the energy in the user output light pulse.

7. The apparatus of claim 3 further comprising:
the selection mechanism comprises a pulse chopper separating the laser output light pulse into a first portion comprising substantially one half of the energy in the laser output light pulse and a second portion comprising substantially the other half of the energy in the laser output light pulse.

8. The apparatus of claim 4 further comprising:
the selection mechanism comprises a pulse chopper separating the laser output light pulse into a first portion comprising substantially one half of the energy in the laser output light pulse and a second portion comprising substantially the other half of the energy in the laser output light pulse.

9. The apparatus of claim 5 further comprising:
the combining mechanism comprises a first optical path and a second optical path the second optical path having a delay sufficient to substantially overlap the first portion and the second portion at the output of the first and second optical paths.

10. The apparatus of claim 6 further comprising:
the combining mechanism comprises a first optical path and a second optical path the second optical path having a delay sufficient to substantially overlap the first portion and the second portion at the output of the first and second optical paths.

11. The apparatus of claim 7 further comprising;
the combining mechanism comprises a first optical path and a second optical path the second optical path having a delay sufficient to substantially overlap the first portion and the second pardon at the output of the first and second optical paths.

12. The apparatus of claim 8 further comprising:
the combining mechanism comprises a first optical path and a second optical path the second optical path having a delay sufficient to substantially overlap the first portion and the second portion at the output of the first and second optical paths.

13. The apparatus of claim 5 further comprising:
the selection mechanism comprises a first actuated optical element actuated to select the first selected portion and a second actuated optical clement actuated to select the second selected portion.

14. The apparatus of claim 6 further comprising:
the selection mechanism comprises a first actuated optical element actuated to select the first selected portion and a second actuated optical element actuated to select the second selected portion.

15. The apparatus of claim 7 further comprising:
the selection mechanism comprises a first actuated optical element actuated to select the first selected portion and a second actuated optical element actuated to select the second selected portion.

16. The apparatus of claim 8 further comprising:
the selection mechanism comprises a first actuated optical element actuated to select the first selected portion and a second actuated optical element actuated to select the second selected portion.

17. The apparatus of claim 9 further comprising:
the selection mechanism comprises a first actuated optical element actuated to select the first selected portion and a second actuated optical element actuated to select the second selected portion.

18. The apparatus of claim 10 further comprising:
the selection mechanism comprises a first actuated optical element actuated to select the first selected portion and a second actuated optical element actuated to select the second selected portion.

19. The apparatus of claim 11 further comprising:
the selection mechanism comprises a first actuated optical element actuated to select the first selected portion and a second actuated optical element actuated to select the second selected portion.

20. The apparatus of claim 12 further comprising:
the selection mechanism comprises a first actuated optical element actuated to select the first selected portion and a second actuated optical element actuated to select the second selected portion.

21. The apparatus of claim 5 further comprising:
the first and second actuated optical elements comprise electrically actuated optical elements operative to change the polarization, respectively, of the first selected portion and the second selected portion, and further comprising:
a first polarization, specific reflective element in the path between the first actuated optical element and the power amplifier and a second polarization specific reflective element in the path between the second actuated optical element and the power amplifier.

22. The apparatus of claim 6 further comprising:
the first and second actuated optical elements comprise electrically actuated optical elements operative to change the polarization, respectively, of the first selected portion and the second selected portion, and further comprising:
a first polarization specific reflective element in the path between the first actuated optical element and the power amplifier and a second polarization specific reflective element in the path between the second actuated optical element and the power amplifier.

23. The apparatus of claim 7 further comprising:
the first and second actuated optical elements comprise electrically actuated optical elements operative to change the polarization, respectively, of the first selected portion and the second selected portion, and further comprising:
a first polarization specific reflective element in the path between the first actuated optical element and the power amplifier and a second polarization specific reflective element in the path between the second actuated optical element and the power amplifier.

24. The apparatus of claim 8 further comprising:
the first and second actuated optical elements comprise electrically actuated optical elements operative to change the polarization, respectively, of the first selected portion and the second selected portion, and further comprising:
a first polarization specific reflective element in the path between the first actuated optical element and the power amplifier and a second polarization specific reflective element in the path between the second actuated optical element and the power amplifier.

25. The apparatus of claim 9 further comprising:
the first and second actuated optical elements comprise electrically actuated optical elements operative to change the polarization, respectively, of the first selected portion and the second selected portion, and further comprising:
a first polarization specific reflective element in the path between the first actuated optical element and the power amplifier and a second polarization specific reflective element in the path between the second actuated optical element and the power amplifier.

26. The apparatus of claim 10 further comprising:
the first and second actuated optical elements comprise electrically actuated optical elements operative to change the polarization, respectively, of the first selected portion and the second selected portion, and further comprising:
a first polarization specific reflective element in the path between the first actuated optical element and the power amplifier and a second polarization specific reflective element in the path between the second actuated optical element and the power amplifier.

27. The apparatus of claim 11 further comprising:
the first and second actuated optical elements comprise electrically actuated optical elements operative to change the polarization, respectively, of the first selected portion and the second selected portion, and further comprising:
a first polarization specific reflective element in the path between the first actuated optical element and the power amplifier and a second polarization specific reflective element in the path between the second actuated optical element and the power amplifier.

28. The apparatus of claim 12 further comprising:
the first and second actuated optical elements comprise electrically actuated optical elements operative to change the polarization, respectively, of the first selected portion and the second selected portion, and further comprising:
a first polarization specific reflective element in the path between the first actuated optical element and the power amplifier and a second polarization specific reflective element in the path between the second actuated optical element and the power amplifier.

* * * * *